(12) United States Patent
Lesso

(10) Patent No.: US 10,574,256 B1
(45) Date of Patent: Feb. 25, 2020

(54) MODULATORS

(71) Applicant: Cirrus Logic International Semiconductor Ltd., Edinburgh (GB)

(72) Inventor: John Paul Lesso, Edinburgh (GB)

(73) Assignee: Cirrus Logic, Inc., Austin, TX (US)

( * ) Notice: Subject to any disclaimer, the term of this patent is extended or adjusted under 35 U.S.C. 154(b) by 18 days.

(21) Appl. No.: 16/141,555

(22) Filed: Sep. 25, 2018

(51) Int. Cl.
H03M 1/50 (2006.01)
G04F 10/00 (2006.01)

(52) U.S. Cl.
CPC ............ H03M 1/50 (2013.01); G04F 10/005 (2013.01)

(58) Field of Classification Search
CPC ............ H03M 1/50; H03M 1/12; H03M 3/30; H03M 3/50; H03M 7/3004; H03M 1/00; G04F 10/005
USPC ........................................ 341/166, 155, 143
See application file for complete search history.

(56) References Cited

U.S. PATENT DOCUMENTS

| 4,199,697 | A  * | 4/1980  | Edwards ............ H03H 11/126 327/91 |
| 6,118,879 | A  * | 9/2000  | Hanna ................ G10L 19/008 348/481 |
| 8,472,560 | B2 * | 6/2013  | Rezayee ............ G06K 7/10128 340/10.1 |
| 8,564,471 | B1 * | 10/2013 | Gao .................... G04F 10/005 341/155 |
| 8,872,580 | B2 * | 10/2014 | Alzaher ............ H03H 11/0422 327/553 |
| 8,896,371 | B2 * | 11/2014 | Alzaher ............ H03H 11/0422 327/553 |
| 8,975,957 | B1 * | 3/2015  | Yuan .................... H03F 3/2175 330/10 |
| 9,425,813 | B2 * | 8/2016  | Lesso .................... H03M 1/18 |
| 9,705,519 | B1 * | 7/2017  | Baringer ............ H03M 7/3073 |
| 2012/0087502 | A1 * | 4/2012 | Hanna .................. G10L 19/008 381/4 |
| 2014/0015602 | A1 * | 1/2014 | Alzaher ............ H03H 11/0422 327/553 |

* cited by examiner

Primary Examiner — Jean B Jeanglaude
(74) Attorney, Agent, or Firm — Jackson Walker L.L.P.

(57) ABSTRACT

This application relates to time-encoding modulators (TEMs). A TEM (100) receives an input signal ($S_{IN}$) and outputs a time-encoded output signal ($S_{OUT}$). A filter arrangement (102) receives the input signal and also a feedback signal ($S_{FB}$) from the TEM output, and generates a filtered signal ($S_{FIL}$) based, at least in part, on the feedback signal. A comparator (101) receives the filtered signal and outputs a time-encoded signal ($S_{PWM}$) based at least in part on the filtered signal. The time encoding modulator is operable in a first mode with the filter arrangement configured as an active filter and in a second mode with the filter arrangement configured as a passive filter. The filter arrangement may include an op-amp (103), capacitance (104) and switch network (105). In the first mode the op-amp (103) is enabled, and coupled with the capacitance (104) to provide the active filter. In the second mode the op-amp (103) is disabled and the capacitance coupled to a signal path for the feedback signal to provide a passive filter.

20 Claims, 8 Drawing Sheets

MODULATORS

FIELD OF DISCLOSURE

The field of representative embodiments of this disclosure relates to methods, apparatus and/or implementations concerning or relating to modulators for signal modulation, and especially to time-encoding modulators such as modulators for generating pulse-width modulation signals.

BACKGROUND

Signal modulators are utilized in a number of applications, for instance as part of the conversion from analogue signals to digital signals. For example sigma-delta (ΣΔ) modulators (SDM's) are a type of signal modulator that may be used to convert an input analogue signal into a pulse-density-modulated (PDM) signal comprising a series of digital ones and zeros at a fixed sample rate where the relative density of ones and zeros corresponds to the analogue signal's amplitude. However the fixed sampling frequency inevitably introduces quantisation noise into the signal, and SDMs usually comprise also at least one functional operational amplifier.

Time-encoding modulators (TEMs) are modulators that encode input signals into a time-encoded data stream. One particular form of time-encoding is pulse-width modulation (PWM). In a PWM signal, an input value is encoded by the duration of a given output signal level, e.g. the duration or width of pulse of a first signal level, compared to the duration of any period(s) of any other signal level(s) in a cycle period. For a conventional two-level PWM signal, the input signal value may be encoded by the duty cycle of a pulse of a first signal level within the cycle period, i.e. the proportion of the cycle period spent at the first output signal level. Time-encoding modulators may encode an input signal into a PWM signal by comparing the input signal with a periodic reference signal, such as a triangular waveform to encode the input signal by the duration of pulses in the output signal. However this requires circuitry to generate an appropriately accurate periodic reference signal and/or operational amplifier (op-amp) circuitry.

In general there is a desire for smaller and/or lower power signal modulators that can be used, for example, as part of a signal converter such as an analogue-to-digital converter (ADC).

In particular, in some applications a modulator may be used, e.g. as part of an ADC, in a signal path that may be intended to operate continuously to be able to receive data at any time, but where data of interest may only be received periodically. For example, some devices, such as mobile phones, voice assistants, personal assistants etc., may have the functionality to be able to respond to voice commands. Such devices may thus have a microphone for receiving acoustic signals, an ADC for converting the received audio into a digital signal and a speech recognition processor for processing the digital audio to identify spoken commands. In some instances the voice control functionality may be enabled by a user physically interacting with some user interface of the device, and thus the relevant signal path including the ADC and speech processor may only be enabled in response to such user input. However for a convenient hands-free user experience it would be desirable for a user to be able to speak commands directly without first having to prime the device by pressing a button for example. Such functionality requires the relevant signal path to be able to receive and identify suitable spoken commands at any time. However having the microphone, ADC and speech processor all continually powered and active would involve a reasonably significant and continuous power consumption and, especially for battery powered devices, power consumption is important. Similar considerations also apply to microphones and circuitry that may be arranged to receive data transmitted at ultrasonic frequencies for machine-to-machine communication.

It is therefore known that some elements, such as a speech processor, may be disabled and substantially unpowered unless and until it is determined that there is significant signal content in the output of the microphone and, in some implementations, that the significant activity corresponds to a particular signal of interest, e.g. speech or an ultrasonic data signal. To provide this functionality, the microphone and ADC may be powered, with some minimal processing of the resultant digital audio signal to determine whether there is any significant activity. If significant activity is detected, other processing elements may be enabled, possibly in a series of stages, e.g. to verify that the activity corresponds to speech and/or corresponds to a defined command word or phrase and/or corresponds to a particular user. In this way only the microphone and ADC, and some minimal activity detector, are continuously powered and active. It would therefore be desirable for the ADC to be operable with a relatively low power consumption for such 'always-on' operation.

Once relevant activity is confirmed various additional processing modules may be fully enabled to process the signals, e.g. to apply speech processing, and in some applications it may be desirable for the signal path to be relatively high quality so as to reduce errors in the processing. Additionally or alternatively the microphone and ADC might also, at other times, be used for other purposes. For example the same microphone and ADC may also be used, for example for voice calls or recording audio, so as to avoid having to provide an entirely separate audio path. For such other uses a high quality audio signal may be desirable and therefore it may therefore be desirable that the ADC be operable with relatively high quality.

SUMMARY

Embodiments of the present disclosure relate to improved time encoding modulators.

According to an aspect of the disclosure there is provided a time encoding modulator apparatus comprising:
  an input for receiving an input signal and an output for outputting an output signal;
  a filter arrangement configured to receive the input signal and a feedback signal from the output and generate a filtered signal based at least in part on the feedback signal; and
  a comparator configured to receive the filtered signal and output a time-encoded signal based at least in part on the filtered signal,
  wherein the time encoding modulator is operable in a first mode with the filter arrangement configured as an active filter and in a second mode with the filter arrangement configured as a passive filter; and
  wherein the output signal is based on the time-encoded signal.

The filter arrangement may comprise at least a first operational amplifier which is enabled in the first mode and disabled in the second mode. The filter arrangement may comprise at least a first capacitance and a switch network. The switch network may comprise a plurality of switches operable to establish different signal paths via the filter arrangement in said first and second modes. In some implementations, in the first mode, the filter arrangement may be configured with the first capacitance coupled across the first operational amplifier.

In some implementations, the filter arrangement may be configured such that, in the first mode, the input signal is combined with the feedback signal and supplied to an input of the first operational amplifier such that the filtered signal depends on the combined input signal and feedback signal. The comparator may, in such a mode, be configured to compare the filtered signal to at least one defined threshold.

In some implementations, the filter arrangement may be configured such that, in the second mode, the feedback signal is supplied to a first node of the filter arrangement and the first capacitance is coupled between said the node and a defined voltage reference. In some implementations, in the second mode, an output stage of the first operational amplifier may be controlled to provide this defined voltage reference.

In some implementations, in the second mode, the filter arrangement may be configured such that the input signal is combined with the feedback signal at the first node such that the filtered signal depends on the combined input signal and feedback signal. The comparator may be configured to compare the filtered signal to at least one defined threshold in such a second mode. Alternatively, in some implementations, the filter arrangement may be configured in the second mode such that the first node is coupled to one input of the comparator, so that the filtered signal depends on the feedback signal, and the input signal may be supplied to another input of the comparator such that the comparator is configured to compare the filtered signal to the input signal. In such a case, the filter arrangement may be configured such that, in the first mode, the filtered signal is supplied to a first comparator input of the comparator, with a second comparator input of the comparator coupled to a threshold signal, and in the second mode the filtered signal is supplied to the second comparator input and the input signal is supplied to the first comparator input.

The time encoding modulator apparatus may comprise a controlled inverter for selectively inverting the time-encoded signal output from the comparator in one of the first and second modes and not in the other of said first and second modes.

The comparator may be a hysteretic comparator. In which case the hysteresis applied by the hysteretic comparator may, in some implementations, be controllably variable. The time encoding modulator apparatus may be configured such that hysteresis applied is different in the first and second modes. Additionally or alternatively the time encoding modulator apparatus may comprise a delay element which is configured to apply a delay between a change in state of the time-encoded signal and a corresponding change in state of the feedback signal. The delay applied by the delay element may be controllably variable. The time encoding modulator apparatus may be configured such that delay applied is different in the first and second modes.

In some implementations the filter arrangement may be configured such that, in the first mode, the active filter is a second order or higher order filter. For example the filter arrangement may further comprises at least a second op-amp and a second capacitance. In the first mode the second operational amplifier may be enabled with the second capacitance coupled across the second operational amplifier and configured so as to form a second-order or higher filter with the first operational amplifier. In the second mode the first operational amplifier and second operational amplifier may be both disabled.

The filter arrangement may comprise a current generator configured to receive the feedback signal and supply first or second steering currents of defined magnitude but opposite polarity based on the feedback signal.

The time encoding modulator apparatus may further comprise a mode controller for selectively controlling operation in the first mode or the second mode. The mode controller may be configured to control operation of the time-encoding modulator circuit in the first mode or the second mode based on the output signal.

Embodiments also relate to circuits comprising a time encoding modulator apparatus according to any of the variants described herein and further comprising a counter configured to receive the output signal from the time-encoding modulator and also a counter clock signal and to generate at least one count value of a number of periods of the counter clock signal in periods defined by the output signal. The circuit may comprise a clock generator for generating the counter clock signal. The clock generator may be configured to generate the counter clock signal with a first frequency in the first mode and a second, lower, frequency in the second mode.

The time-encoding modulator apparatus may comprises a latching element operable to receive a first clock signal synchronised to the counter clock signal and which is operable to synchronise any signal transitions output from the latching element to the first clock signal, such that any signal transitions in the output from the modulator are synchronised to the first clock signal. The time-encoding modulator apparatus may be configured such that the latching element is enabled in the first mode and disabled in the second mode. In implementation with a mode controller, the mode controller may be configured to receive at least one count value from the counter and selectively control operation in the first or second mode based on the received at least one count value. For example, when operating in the second mode, the mode controller may be configured to compare the received at least one count value to a threshold and to transition to the first mode if the threshold is crossed.

A circuit including the TEM and counter may further comprise a demodulator configured to receive said least one count value and generate a digital signal indicative of the value of the input signal. The demodulator may be configured to operate at a lower sample rate than the counter. The mode controller, if present, may be configured to receive the digital signal from the demodulator and selectively control operation in the first or second mode based on said digital signal from the demodulator.

The circuit may be implemented as an integrated circuit. Aspects also relate to an electronic device comprising a time encoding modulator apparatus according to any of the variants described herein, or a circuit including such a time encoding modulator apparatus. The device may be at least one: a portable device; a battery powered device; a communications device; a mobile or cellular telephone; a smartphone; a computing device; a notebook, laptop or tablet computing device; a wearable device; a smartwatch; a voice-controlled device; a gaming device.

In another aspect there is provided a time encoding modulator comprising: an input for receiving an input signal and an output for outputting an output signal; a reconfigurable filter arrangement configured to receive the input signal and a feedback signal from the output and generate a filtered signal; and a comparator configured to receive the filtered signal and output a time-encoded signal based at least in part on the filtered signal, wherein reconfigurable filter arrangement comprises a first op-amp, a first capacitance and a switch network and wherein the reconfigurable filter arrangement is configurable in: a first mode with the first op-amp enabled in a first signal path for at least the feedback signal and configured with the first capacitance to provide filtering to the first signal path; and a second mode with the first capacitance coupled to a node of a second signal path for at least the feedback signal to provide filtering to the second signal path, wherein the second signal path bypasses the first op-amp.

In a further aspect there is provided a time-encoding modulator, the time-encoding modulator comprising: an input node for receiving an input signal from a modulator input; a filter arrangement coupled to the input node; a comparator operable to receive a first signal from the filter arrangement at a first comparator input and generate a time-encoded signal; a modulator output for outputting an output signal based on the time encoded signal; and a feedback path extending from the modulator output to a first node of the filter arrangement;

wherein the filter arrangement comprises a first op-amp and first capacitance, and wherein the filter arrangement is selectively configurable in: a first configuration with the first op-amp in a signal path between the first node and the first comparator input and the first capacitance coupled across the first op-amp; and a second configuration in which the first node is connected to the first comparator input via a signal path that bypass the first op-amp, and the first capacitance is electrically connected between the first node and a reference voltage.

Aspects also relate to a reconfigurable filter arrangement comprising: an input node for receiving an input signal; a feedback node for receiving a feedback signal; a first op-amp; a first capacitance; and a switch network;

wherein the reconfigurable filter arrangement is configurable: in a first mode to enable the first op-amp with the first capacitance as an active filter for the input signal and the feedback signal; and a second mode to disable the first op-amp and couple the first capacitance as a passive filter for at least the feedback signal.

Unless expressly indicated to the contrary, any of the various features of the various implementations discussed herein may be implemented together with any one or more of the other described features in any and all suitable combinations.

BRIEF DESCRIPTION OF THE DRAWINGS

For a better understanding of examples of the present disclosure, and to show more clearly how the examples may be carried into effect, reference will now be made, by way of example only, to the following drawings in which.

DETAILED DESCRIPTION

The description below sets forth example embodiments according to this disclosure. Further example embodiments and implementations will be apparent to those having ordinary skill in the art. Further, those having ordinary skill in the art will recognize that various equivalent techniques may be applied in lieu of, or in conjunction with, the embodiments discussed below, and all such equivalents should be deemed as being encompassed by the present disclosure.

Embodiments of the present disclosure relate to time-encoding modulators (TEMs) and in particular to PWM (pulse-width modulation) modulators, and especially to self-oscillating TEMs.

In embodiments of the disclosure the TEM may be selectively operable in at least first and second modes. The TEM may be reconfigurable so as to operate in a first configuration in the first mode and in a second, different, configuration in the second mode. The first mode may be a higher quality mode than the second mode, but the second mode may be lower power mode than the first mode. This allows the TEM to be operated in the second mode when low power consumption is important, such as to provide an 'always-on' functionality for detecting voice commands or ultrasonic data transfer etc. at any time. The TEM can be operated in the first mode when higher quality is more important. In some embodiments the plurality of modes may be implemented by selectively enabling or disabling at least one operational amplifier (op-amp). When enabled in the first mode the op-amp may form part of an integrator for integrating a combined input and feedback signal. When disabled, the op-amp may be bypassed, although a capacitance used as part of the integrator in the first mode may be used as part of a filter arrangement in the second mode. When disabled, the op-amp may be powered down, thus reducing power consumption. The TEM may thus have a filter arrangement that can be selectively reconfigured in the first and second modes.

Figure 1A:
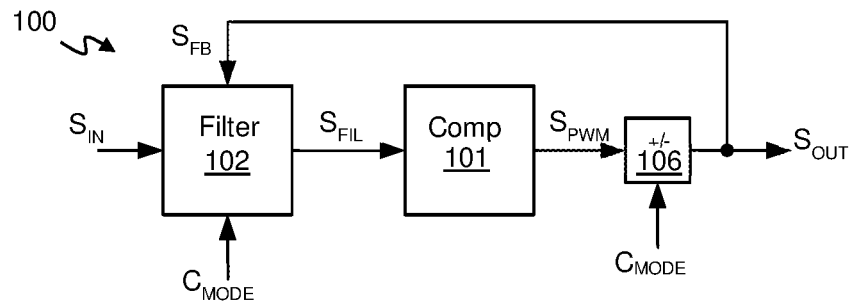
FIGS. 1a and 1b illustrates a time-encoding modulator according to an embodiment.
Figure 1B:
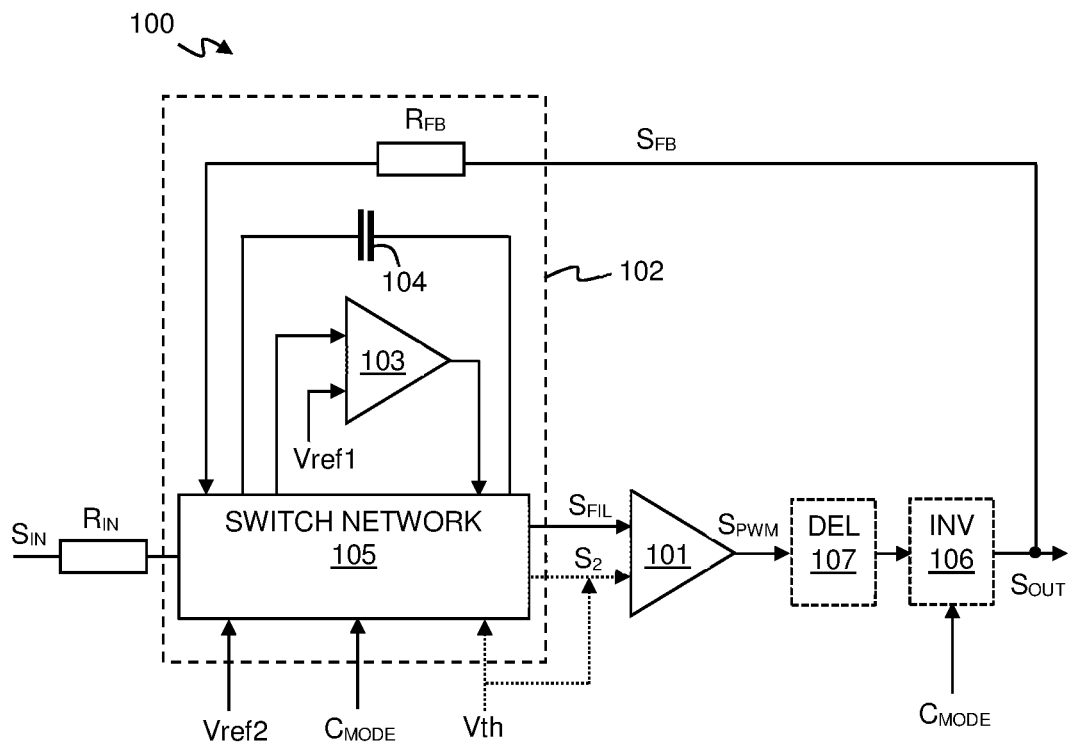

FIG. 1a illustrates a TEM 100 according to one embodiment and FIG. 1b illustrates the TEM 100 in more detail. The TEM 100 is arranged to receive an input signal $S_{IN}$ at a TEM input and provide an output signal $S_{OUT}$ at a TEM output. The input signal $S_{IN}$ may be an analogue input signal, as may be received from a transducer such as a microphone (not illustrated) for example. The TEM 100 is arranged to convert the input signal $S_{IN}$ into an output time-encoded signal $S_{OUT}$, which may, in particular, be a pulse-width-modulated (PWM) signal. The PWM signal may be a two-level signal that varies between first and second different output states, e.g. voltage levels, so as to encode the value of the input signal $S_{IN}$ by the relative durations of the first and second output states in a cycle period, i.e. by the duty cycle of pulses of the first output state.

The TEM comprises a comparator 101 which, in use, is arranged within a forward signal path between the TEM input and the TEM output. The TEM also has a filter arrangement 102 which is configured to receive a feedback signal $S_{FB}$ derived from the TEM output and to supply a filtered signal $S_{FIL}$ to a first comparator input of the comparator 101. The filtered signal $S_{FIL}$ is dependent on at least the feedback signal $S_{FB}$ so that the comparator 101 is arranged within a feedback loop as part of a self-oscillating modulator arrangement. In embodiments of the present disclosure the TEM is operable in at least first and second different operating modes, wherein the configuration of the filter arrangement 102 is different in the different operating modes.

The comparator 101 is configured to compare the filtered signal $S_{FIL}$ received at the first comparator input to at least one defined value which, in some embodiments may be defined by a signal S2 received at a second comparator input, as illustrated in FIG. 1b. The comparator 101 outputs, at a comparator output, either the first output state or second output state, which may, for example, be high and low voltages $V_H$ and $V_L$ respectively, depending on the comparison. The output signal of the comparator 101 is thus a two-level PWM signal $S_{PWM}$ and the output time encoded signal $S_{OUT}$ is based on the PWM signal $S_{PWM}$ output from the comparator 101.

In some embodiments the defined value(s) may be defined by a threshold signal Vth supplied to the second comparator input. The threshold signal Vth may correspond to a defined midlevel voltage $V_{MID}$ which is midway between the voltage levels of the output states, i.e. $V_{MID}=(V_H+V_L)/2$. This may also correspond to the signal level of a quiescent input signal, i.e. an input signal $S_{IN}$ of zero magnitude. In some embodiments $V_H$ and $V_L$ may be equal in magnitude but opposite in sign and so $V_{MID}$ may correspond to ground potential.

In some instances the comparator 101 may be a hysteretic comparator and thus may apply some hysteresis to the comparison. In which case, a threshold at which the comparator transitions from the first output state to the second output state may be different to a threshold at which the comparator transitions from the second output state to the first output state. The relevant thresholds will still be defined by the threshold signal Vth but will also depend on the amount of hysteresis applied by the comparator 101, e.g. for symmetric hysteresis the thresholds may be Vth+H and Vth−H respectively, where H is an indication of the amount of hysteresis. In some embodiments however there may not be an explicit second comparator input for receiving a threshold signal Vth and the threshold(s) may depend on a baseline threshold defined by the structure of the comparator itself, plus the amount of hysteresis applied, if any.

Referring to FIG. 1b, the filter arrangement 102 receives the feedback signal $S_{FB}$ and also the input signal $S_{IN}$ and generates the filtered signal $S_{FIL}$ based on at least the feedback signal $S_{FB}$ as will be discussed in more detail below. The filter arrangement 102 includes a first op-amp 103 and first capacitance 104 and also a switch network 105. The switch network 105 includes one or more switches which are operable to vary the signal paths within the filter arrangement 102 for the feedback signal $S_{FB}$ and input signal $S_{IN}$. The switch network 105 may be selectively controlled by a mode control signal $C_{MODE}$ such that the TEM 100 is operable in at least first and second different operating modes, where the configuration of a filter provided by the filter arrangement 102 is different in each operating mode.

Figure 2A:
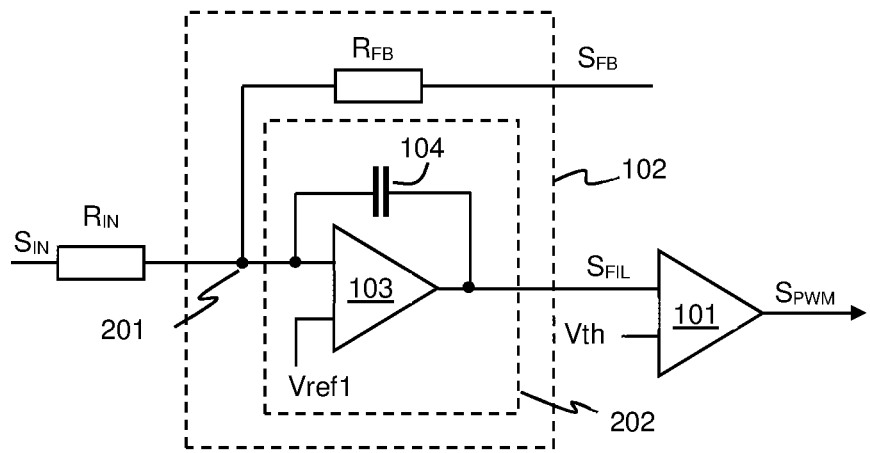
FIGS. 2a to 2c illustrates various different operating modes of the time-encoding modulator.

FIG. 2a illustrates one example of a configuration of the filter arrangement in the first operating mode. The feedback signal $S_{FB}$ is supplied to a first node 201 of the filter arrangement. In this example the feedback signal $S_{FB}$ is combined with the input signal $S_{IN}$ at the first node 201. In the first mode the first op-amp 103 is enabled and coupled in a signal path for providing the filtered signal $S_{FIL}$, with the first capacitance 104 coupled across the first op-amp 103 i.e. coupled between the first node 201 and an output of the first op-amp 103. The first node 201 is coupled to one input of the first op-amp 103 and a second input of the first op-amp 103 is coupled to a defined reference voltage Vref1, which may correspond to the midlevel voltage $V_{MID}$.

As will be understood by one skilled in the art, in the first mode, the first op-amp 103 and first capacitance 104 will function as an integrator 202 and integrate the signal at the first node 201, i.e. the combined input and feedback signal, with respect to the voltage reference Vref1. The output of the first op-amp 103 will thus be a signal that ramps up or down, and in which the direction of ramping and the rate of ramping depends on the combination of the input signal $S_{IN}$ and the feedback signal $S_{FB}$. In the example of FIG. 2a, the input signal $S_{IN}$ and the feedback signal $S_{FB}$ are applied to the first node 102 via respective impedances $R_{IN}$ and $R_{FB}$ to provide a combined current ($i_{IN}+i_{FB}$) at the input of the integrator 202 provided by the first op-amp 103 and first capacitance 104. The output of the first op-amp 103, which is provided to the first input of the comparator 101, thus increases or decreases over time at a rate defined by this combined current ($i_{IN}+i_{FB}$).

Figure 2B:
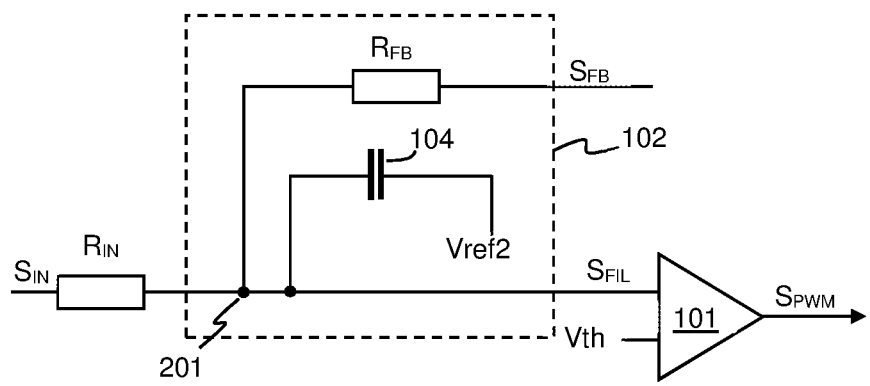

FIG. 2b illustrates one example of a configuration of the filter arrangement 102 in one example of a second operating mode. In this example the feedback signal $S_{FB}$ is again combined with the input signal $S_{IN}$ at the first node 201, and in this example the input signal $S_{IN}$ and the feedback signal $S_{FB}$ are again applied to the first node 102 via respective impedances $R_{IN}$ and $R_{FB}$ to provide a combined current ($i_{IN}+i_{FB}$) at the first node 201. In the second mode, however the first op-amp 103 is bypassed and the first capacitance 104 is coupled between the first node 201 and a defined reference voltage Vref2. In this mode the first capacitance 104 will be charged or discharged based on the combined current signal ($i_{IN}+i_{FB}$) from the input signal $S_{IN}$ and the feedback signal $S_{FB}$, and thus the voltage at the first node 201 will ramp up or down at a rate defined by this combined current. Again therefore the signal at the first input to the comparator 101 will ramp up or down, and with a ramp rate that depends on both the input signal $S_{IN}$ and the feedback signal $S_{FB}$. In some embodiments the reference voltage Vref2 may be the mid-level voltage $V_{MID}$, although this reference voltage could be any defined voltage, for instance ground even if the mid-level voltage $V_{MID}$ is not equal to ground. As explained below with reference to FIGS. 5a to 5e, the action of the feedback loop will be to charge and discharge the first capacitance such that node 201 ripples in voltage within a certain range around the level of the threshold Vth of the comparator 101, which may be set to $V_{MID}$.

Figure 2C:
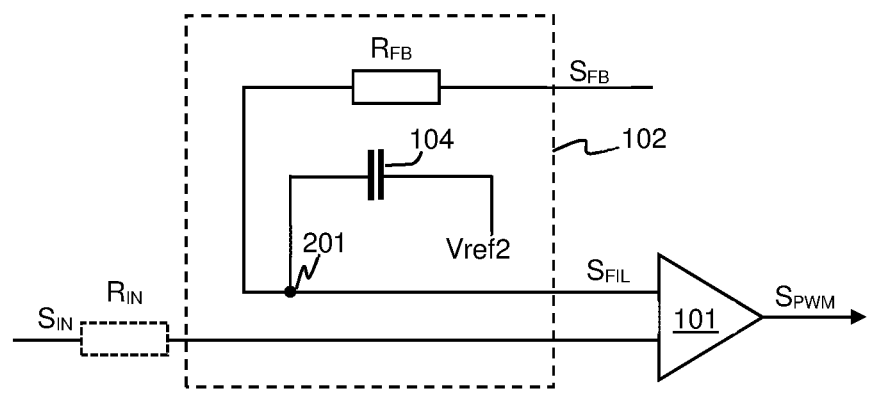

FIG. 2c illustrates one example of an alternative configuration of the filter arrangement 102 that could be implemented in the second operating mode. In this example the feedback signal is again supplied to a first node 201 and the first capacitance is coupled between the first node 201 and a defined reference voltage Vref2, with the first op-amp 103 being bypassed. In this example configuration however the input signal $S_{IN}$ is not supplied to the first node 201 and, instead, is supplied as the signal S2 to the second comparator input of comparator 101. In this configuration the first capacitance 104 will be charged or discharged based on the current signal ($i_{FB}$) from the feedback signal $S_{FB}$ only and the voltage of the first capacitance 104 will ramp up or down depending on the state of the feedback signal $S_{FB}$. However, the input signal $S_{IN}$ is supplied to the second comparator input of comparator 101 and the action of the feedback loop will be to maintain the DC offset of the voltage at the first comparator input, i.e. node 201, at substantially the same voltage as the input signal $S_{IN}$. The DC offset voltage of the first capacitance 104 will thus be substantially equal to the value of the input signal $S_{IN}$. As such the voltage difference across resistor $R_{FB}$, and hence the charging or discharging current, will depend on the voltage difference the feedback signal, $V_H$ or $V_L$, and the value of the input signal $S_{IN}$. In this way the voltage at the first comparator input of comparator 101 will again be a signal that ramps up and down with a ramp rate that depends on the value of the input signal $S_{IN}$ and the feedback signal $S_{FB}$. Note that in the configuration illustrated in FIG. 2c, the input signal is supplied directly to an input of the comparator 101, which may be high impedance. Thus in this configuration the input signal $S_{IN}$ could be supplied to the second comparator input by a path that bypasses input resistance $R_{IN}$.

The level of the feedback signal $S_{FB}$ and the level of the input signal $S_{IN}$ are set such that, in each of the first and second modes, the direction of ramping is defined by the state of the feedback signal $S_{FB}$, i.e. $V_H$ or $V_L$, with the rate of ramping being defined by the level of the input signal and the feedback signal.

In the example configuration of the first mode of operation illustrated in FIG. 2a, the integrator 202 may have an inverting configuration, meaning that the filtered signal $S_{FIL}$ may ramp downwards when the feedback signal $S_{FB}$ is in the high state $V_H$. However in the configurations of the second mode illustrated in FIGS. 2b and 2c, the filtered signal may ramp upwards when the feedback signal is in the high state $V_H$. In some embodiments this change in polarity of the filtered signal $S_{FIL}$ with respect to the feedback signal $S_{FB}$ in the different operating modes may be undesirable with respect to downstream processing. The change in polarity may also cause issues when switching between the two modes of operation as the polarity of the feedback loop becomes inverted. Referring back to FIG. 1b, in some embodiments therefore the TEM 100 may include a selectively controlled inverter 106 for applying a selective inversion to the PWM signal $S_{PWM}$ in one of the operating mode. FIG. 1b illustrates that the inverter may be located in the signal path between the output of comparator 101 and the TEM output. In some implementations the selective inverter could be implemented by an XOR gate that receives a version of the PWM signal $S_{PWM}$ and a binary mode control signal $C_{MODE}$. In some implementations the selective inverter could be subsumed in the structure of the comparator 101, for instance by incorporating interchangeable connections to the inputs or outputs of its input stage.

It can thus be seen that in each of the first mode and the second mode (whether the second mode variant of FIG. 2b or the variant of FIG. 2c), there is some filtering applied to at least the feedback signal $S_{FB}$, and a filtered signal $S_{FIL}$ is supplied to the first input of the comparator 101. The filter arrangement 102 is selectively reconfigurable to provide different operating modes. In each mode the filtered signal $S_{FIL}$ received at the first input of comparator 101 will ramp upwards or downwards depending on the state of the feedback signal $S_{FB}$, which in turn depends on the output state of the comparator 101. The respective rates of the ramping up and ramping down will depend on the level of the input signal $S_{IN}$.

In the second mode of operation the first op-amp 103 is bypassed and not used. As such the first op-amp 103 may be substantially powered down in the second mode of operation. In the example of FIGS. 2b and 2c, in the second mode, the configurable filter arrangement 102 is configured as a passive, first order filter. The TEM 100, when configured in the second configuration for the second mode, can thus can provide low power operation for converting an input analogue signal $S_{IN}$ into an output time-encoded signal $S_{OUT}$. In some embodiments the output signal $S_{OUT}$ may be supplied to a time decoding converter (TDC), which may comprise a simple counter, in order to translate the input-signal-dependent pulse widths or duty cycle to a multi-bit digital format. Thus, collectively a simple TDC and the TEM 100 when operating in the second mode can implement a relatively low power analogue-to-digital converter (ADC) that may, in particular, be suitable for allowing detection of signal activity.

In the first mode, the configurable filter arrangement 102 may be configured as an active filter, and in the example illustrated in FIG. 2a the filter arrangement 102 is configured to comprise a first-order integrator 202, but second or higher order filters could be implemented in the first mode (or other modes) in some implementations.

The use of the first op-amp 103 as part of an integrator in this embodiment, when operating in the first mode, provides a larger low-frequency gain in the feedback loop compared to the passive filter in the second mode. The higher loop gain of the active integrator 202 more effectively suppresses the effect of any imperfections in the feedforward path in the loop, for example thermal or other noise or signal-dependent delay introduced by the comparator 101. Also the first op-amp 103 provides a virtual earth at node 201, whereas in the second mode as illustrated in FIG. 2b, the voltage at node 201 will tend to follow the input signal $S_{IN}$ (with some ripple at the PWM cycle frequency) as it varies over time. The resultant signal-dependent common-mode voltage variation applied to the comparator inputs may introduce non-linearities and distortion.

Thus in the first mode of operation, where an active integrator is employed, the TEM 100 may form part of a relatively high quality signal processing path compared to the second mode, wherein a passive filter is employed, and may, for instance, be used with a suitable time-decoding converter (TDC) to provide part of a relatively high performance analogue-to-digital converter (ADC).

Figure 3:
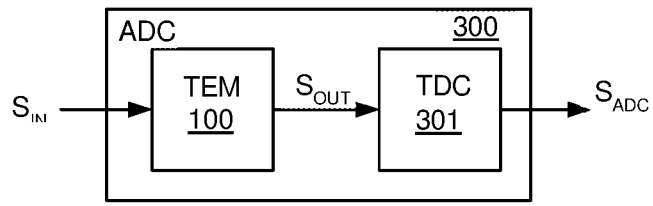
FIG. 3 illustrates an ADC including a time-encoding modulator according to an embodiment.

A TEM 100 according to embodiments of the disclosure can thus be used in the second mode of operation, to allow for low power operation, for example for always-on type functionality when a signal of interest may be received only periodically but at any time. The TEM 100 can also be reconfigured to provide the first mode of operation when desired, e.g. on detection of a signal of interest in the output and/or when required for some other use case, and in the first mode of operation provides an output signal of better quality. The configurable TEM 100 can thus be used as part of an ADC which can be operable in a low power mode (the second mode) or a higher power, but higher quality mode (the first mode), and which can be selectively varied between the two modes of operation as desired. FIG. 3 illustrates an ADC 300 that comprises a configurable TEM 100 operable to receive an input signal $S_{IN}$ and provide TEM output signal $S_{OUT}$ that may be received by a TDC 301 to generate an ADC output $S_{ADC}$.

Figure 4:
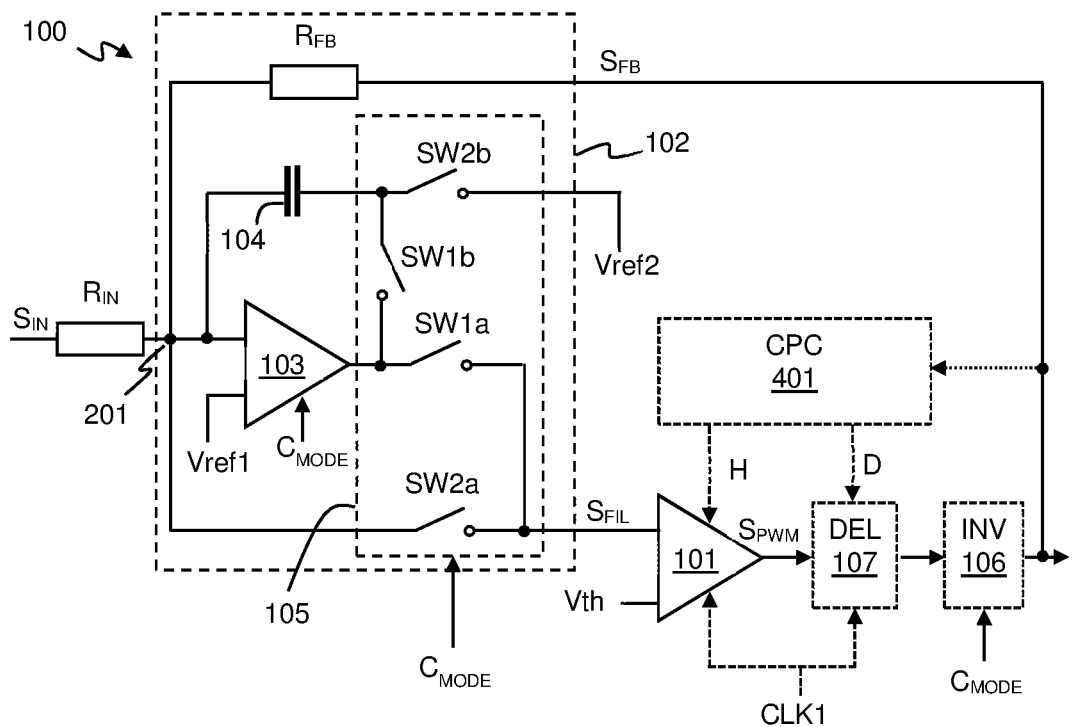
FIG. 4 illustrates on example of a time-encoding modulator according to an embodiment in more detail.

FIG. 4 illustrates one example of a TEM 100 with a configurable filter arrangement 102 that is operable in the first operating mode illustrated in FIG. 2a and in the second operating mode illustrated in FIG. 2b. In this example the switch arrangement 105 comprises four switches SW1a, SW1b, SW2a and SW2b. To provide operation in the first mode, switch SW1a may be closed, i.e. turned-on to be conductive, so as to couple the output of the first op-amp 103 to the first input of comparator 101. Switch SW1b may also be closed to couple the first capacitance 104 across the first op-amp 103, i.e. couple the first node 102 to the output of the first op-amp 103. Switches SW2a and SW2b are open, i.e. turned-off so as to be substantially non-conductive, in the first mode. To provide operation in the second mode, switch SW2a is closed to provide a signal path that bypasses the first op-amp 103. Switch Sw1a is open, so as to isolate the first op-amp from the first input of comparator 101. Switch SW1b is also opened in the second mode, to disconnect the first capacitance 104 from the output of the first op-amp 103 and switch Sw2b is closed to instead couple the first capacitance 104 to the reference voltage.

In some implementations however, in the second mode of operation the first op-amp 103 may be disabled by putting it into a high-impedance mode, e.g. tri-stating the op-amp 103. In such an implementation switch SW1a may not be required, and a path between the output of the first op-amp 103 and the first input of comparator 101 that exists in both the first and second operating modes could be implemented instead. In this case switch SW1b may be closed in the first operating mode, with switches SW2a and SW2b open, and to provide the second operating mode switch SW1b may be opened, switches SW2a and SW2b closed and the first-op 103 tri-stated.

Alternatively, if switch SW1a is present and opened in the second operating mode, and the first op-amp 103 is disabled to a high-impedance mode, switch SW1b may alternatively not be required and a path between the capacitor 104 and output of the first op-amp 103 that exists in both the first and second operating modes may be implemented instead. In this case switch SW1a may be closed in the first operating mode, with switches SW2a and SW2b open, and to provide the second operating mode switch SW1a may be opened, switches SW2a and SW2b closed and the first-op 103 tri-stated.

In some embodiments, where switch SW1a is present, the first op-amp 103 may be controlled in the second operating mode such that its output stage is no longer responsive to the op-amp inputs but is instead configured to clamp the output of the first-op to a defined reference voltage, such as ground. For example an NMOS transistor of the output stage could be driven to clamp the output of the first op-amp to the most negative supply. This may avoid the need for a separate defined reference Vref2 and switch SW2b. Thus in such an arrangement switch SW1b may be replaced with a continuous signal path and the connection to a defined reference Vref via switch SW2b omitted. In this arrangement the switch network may thus comprise switches SW1a and SW2a only. In the first operating mode switch SW1a may be closed and switch SW2a opened and the first op-amp enabled. In the second operating mode switch SW2a is closed, to provide the bypass path, switch SW1a opened to isolate the output of the first op-amp 103 from the comparator 101 and the first op-amp 103 controlled to clamp one side of first capacitance 104 to the defined reference.

To provide desired self-oscillating characteristics, in some embodiments the comparator 101 may be a hysteretic comparator and thus may apply some hysteresis to the comparison. This means that the value of the filtered signal $S_{FIL}$ at the first input of the comparator 101 will need to reach a first threshold to transition from the first output state to the second output state, e.g. from $V_H$ to $V_L$, but will then need to reach a second, different, threshold to transition from the second output state to the first output state. For example for symmetric hysteresis the thresholds may be Vth+H and Vth−H, where H is an indication of the hysteresis applied. Additionally or alternatively, as illustrated in FIG. 4, there may be a delay element 107 provided within the feedback loop so as to provide a controlled delay, where D is an indication of the delay applied, between a change in state in the PWM signal $S_{PWM}$ output from the comparator 101 and a corresponding change in state of the feedback signal $S_{FB}$. In which case the filtered signal $S_{FIL}$ will ramp in one direction until the relevant threshold is reached, at which point the comparator 101 will change output state, but the feedback signal $S_{FB}$ will remain in the same state for the period of the controlled delay, meaning that the filtered signal will continue ramping in the same direction and overshoot the threshold by a certain amount. When the feedback signal $S_{FB}$ does then change state, the filtered signal will need to ramp in other direction from this overshoot level.

Figures 5A, 5B:
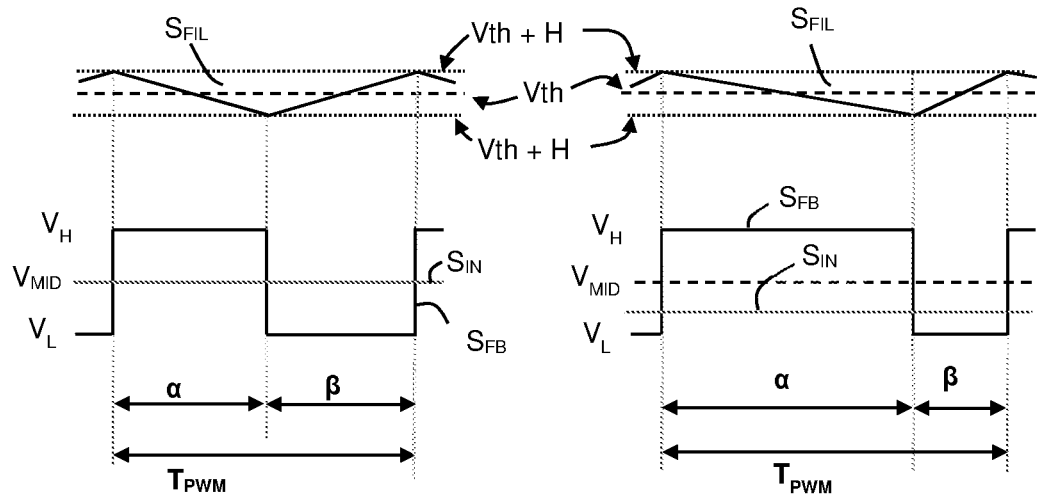
FIGS. 5a to 5e illustrate example waveforms of various example of a time-encoding modulator.

FIGS. 5a and 5b illustrates the principle of operation, in the first mode of operation, of the TEM illustrated in FIG. 4 where the comparator 101 is a hysteretic comparator with no controlled delay applied. In each of FIGS. 5a and 5b, the top plot illustrates waveforms for filtered signal $S_{FIL}$ and illustrates the hysteretic thresholds, which in this are case are symmetric around Vth. The lower plot shows the feedback signal $S_{FB}$ and also the level of the input signal $S_{IN}$. With no controlled delay in the feedback loop, the timing of the feedback signal $S_{FB}$ is substantially the same as the timing of the PWM signal $S_{PWM}$.

In each case the feedback signal $S_{FB}$ (which is tapped from the output signal $S_{OUT}$) is initially in the low state $V_L$ and the filtered signal $S_{FIL}$ is ramping upwards.

The filtered signal $S_{FIL}$ ramps up until it reaches the higher threshold Vth+H, at which point the output state of the comparator 101 changes state to the high output state $V_H$. The feedback signal $S_{FB}$ will thus also change state and thus the filtered signal $S_{FIL}$ starts ramping downwards. The filtered signal $S_{FIL}$ ramps down until it reaches the lower threshold Vth−H, at which point the output of the comparator 101, and hence the feedback signal $S_{FB}$ changes state again. The comparator 101 remains in the low state $V_L$ until the upper threshold is reached again. The output of the comparator 101 is thus a two-level signal with pulses of a first state, e.g. $V_H$, of duration α and pulses of a second state, e.g. $V_L$, of duration β in an overall cycle period $T_{PWM}$ which is equal to α+β.

In the example of FIG. 5a, the input signal $S_{IN}$ is substantially constant (at least over the PWM cycle period) at the midpoint voltage $V_{MID}$ and thus the filtered signal $S_{FIL}$ ramps up and down at the same rate. Thus the duration α is equal to the duration β and the duty cycle is 50%. FIG. 5b illustrates an example where the input signal $S_{IN}$ is a constant signal lower than the midpoint voltage, which results, in this example, in decreasing the downward ramp rate of the filtered signal $S_{FIL}$ and increasing the upward ramp rate. This means that it takes more time for the filtered signal $S_{FIL}$ to ramp down from the upper threshold to the lower threshold than was the case for the example of FIG. 54a, but it takes less time to ramp up from the lower threshold to the upper threshold. The result is that the duration α increases and the duration β decreases. The amount of change in α and β is not equal and the overall cycle period $T_{PWM}$ also changes. The value of the input signal is thus encoded as the duty cycle of the pulses of the PWM cycle, e.g. in this example as $(\beta-\alpha)/(\alpha+\beta)$, or alternatively as $\beta/(\alpha+\beta)$.

Note FIGS. 5a and 5b illustrate operation in the first mode, as shown in the example of FIG. 2a, where the transfer function of filter 102 is generally inverting, in that a more positive value of the feedback voltage $S_{FB}$ (i.e. when the feedback signal $S_{FB}$ is more positive than the reference Vref1) causes a negative-going filtered signal $S_{FIL}$, and also where the polarity of the output of the comparator 101 and any inversion 106 applied to its output are configured such that the resulting transfer function between filtered signal $S_{FIL}$ and the feedback signal $S_{FB}$ is generally non-inverting, i.e. a more negative value of the filtered signal $S_{FIL}$ applied to the comparator causes a more negative value of the feedback signal $S_{FB}$.

However, when configured as illustrated in FIG. 2b, to operate in the second mode of operation, a more positive value of the feedback voltage $S_{FB}$ causes a positive-going filtered signal $S_{FIL}$ and thus the polarity of the output of the comparator 101 and any inversion 106 applied to its output thus need to be re-configured such that a more negative value of the filtered signal $S_{FIL}$ applied to the comparator results in a more negative value of the feedback signal $S_{FB}$. In the example of FIG. 4 this can be achieved by selective inverter 106 be configured to invert the time-encoded signal in the second mode. Operation in the second mode of operation may then be explained similarly to the first mode with reference to FIGS. 5a and 5b, except the polarity of the waveform $S_{FIL}$ is inverted relative to that shown in FIGS. 5a and 5b.

Figures 5C, 5D:
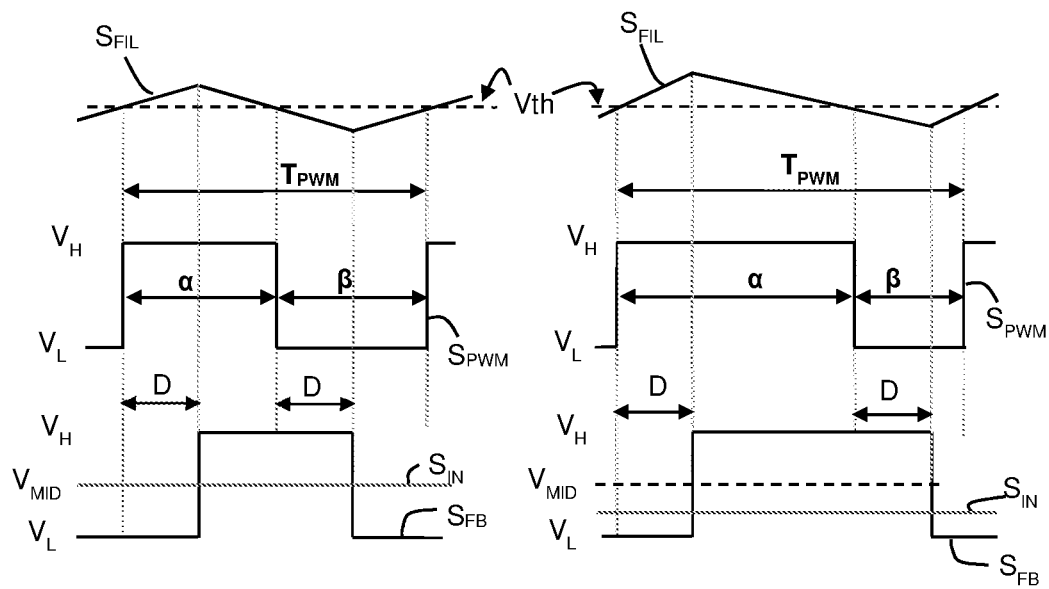

FIGS. 5c and 5d illustrate the principle of a TEM 100 having a delay element 106 to apply a controlled delay D in the feedback loop, with no hysteresis applied by the comparator 101. The top plot of each of FIGS. 5c and 5d again illustrates a waveform for the filtered signal $S_{FIL}$ and, in this case, the single defined threshold Vth. The middle plot shows the output of comparator 101, i.e. the PWM signal $S_{PWM}$, and the lower plot shows the feedback signal $S_{FB}$ which is delayed with respect to the PWM signal $S_{PWM}$ by a controlled delay D. In each case the feedback signal is initially in the low state $V_L$ and the value of the filtered signal $S_{FIL}$ is ramping up. When the filtered signal $S_{FIL}$ reaches the value of the threshold Vth, the PWM signal $S_{PWM}$ output from the comparator 101 changes state. However, this change in state does not propagate to the feedback signal until after the defined delay period D. During this delay period D the feedback signal $S_{FB}$ remains in the low state $V_L$ and thus the filtered signal continues ramping upwards. After the delay period D, the feedback signal $S_{FB}$ changes to the high state $V_H$. At this point the value of the filtered signal $S_{FIL}$ will start ramping-downwards, but from a value which is higher than the level of the threshold Vth. The comparator 101 will thus continue to output the high level state $V_H$ until the level of the filtered signal $S_{FIL}$ reaches the level of the threshold Vth, at which point the output state of the comparator 101 will change. Again however this change in state will not propagate to the feedback signal $S_{FB}$ until after the delay period, at which point the value of the filtered signal $S_{FIL}$ will be lower than the threshold, and the PWM signal $S_{PWM}$ output from the comparator will remain in the low input state $V_L$ until the value of the filtered signal $S_{FIL}$ ramps down to the threshold Vth.

This operation again results in a pulse of the high output state $V_H$ of duration $\alpha$ and a pulse of the low output state $V_H$ of duration $\beta$. FIG. 5c illustrates an example where the input signal $S_{IN}$ is constant over the PWM cycle period and equal to the mid-level voltage and the rate of ramping up is equal to the rate of ramping down. In this case, the amount of overshoot of the threshold during the delay period D is the same for ramping up and ramping down, leading to equal durations $\alpha$ and $\beta$, and a duty cycle of 50%. FIG. 4d illustrates an example where the input signal $S_{IN}$ is a constant, more negative, signal and so the ramp up rate is increased and the ramp down rate is decreased. This means that, when the filtered signal $S_{FIL}$ is ramping up, the amount of overshoot of the threshold Vth during the delay period D is increased and, when the filtered signal $S_{FIL}$ starts ramping down it takes longer to return to the threshold. Conversely, when the filtered signal is ramping down, the amount of overshoot during the delay period is reduced and it takes less time to return to the threshold. Thus the duration $\alpha$ is increased and the duration $\beta$ is reduced. Again the value of the input signal is encoded as the duty cycle of the pulses, e.g. as $(\beta-\alpha)/(\alpha+\beta)$.

Again FIGS. 5c and 5d illustrate the operation in the first mode of operation as shown in FIG. 2a. As discussed with respect to FIGS. 5a and 5b, the polarity of the transfer function from $S_{FB}$ to $S_{FIL}$ via filter 102 is of opposite polarity in the second mode compared to the first mode. The polarity of the transfer function from comparator input signal $S_{FIL}$ to the feedback signal $S_{FB}$ may thus need to be re-configured to adjust appropriately the polarity of the transfer function from the input to the comparator to the feedback signal $S_{FB}$ by reconfiguring the polarity of the output $S_{PWM}$ of the comparator 101 and/or any inversion 106 applied to its output. Operation in the second mode of operation may thus be explained similarly to the first mode with reference to FIGS. 5c and 5d, with appropriate adjustments to the polarities of the waveforms illustrated.

Figure 5E:
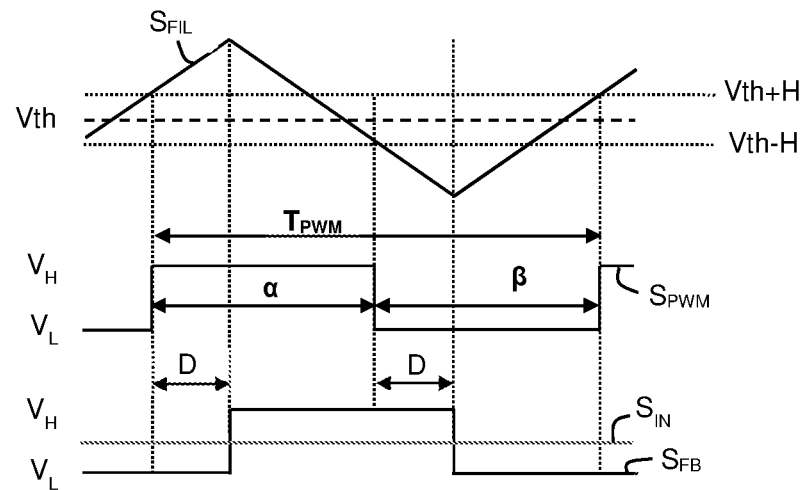

FIG. 5e illustrates similar plots for an example where the comparator 101 applies hysteresis to the comparison and a delay element 107 applied a controlled delay. The principles are the same as described with reference to FIGS. 5a to 5d. When the filtered signal $S_{FIL}$ is ramping up it will ramp to an upper threshold before the comparator 101 changes output state, but the change in state will not propagate to the feedback signal until after the controlled delay, at which point the filtered signal will then need to ramp down to the lower threshold, and vice versa.

For the examples illustrated with respect to FIGS. 5a to 5e the durations of the pulses will vary according to:

$$\alpha = T_0/2*(1-X)$$

$$\beta = T_0/2*(1+X) \qquad \text{Eqn. (1)}$$

and the PWM cycle period $T_{PWM}$ will thus vary according to:

$$T_{PWM} = \alpha + \beta = T_0/(1-X^2) \qquad \text{Eqn. (2)}$$

where X is a where X is a normalised value of the input signal within an input range of +1 to −1 and $T_0$ is the limit cycle period. The normalised input signal value X represents the level of the input signal within an input range, where a normalised magnitude of 1 correspond to the level of the input signal that asymptotically leads to a frequency of zero. In the example discussed above with respect to FIG. 1a value of X=+1 may correspond to $V_H$ and a value of X=−1 may correspond to $V_L$. $T_0$ is the limit cycle period, which corresponds to the PWM cycle period $T_{PWM}$ for an input signal of zero magnitude and will depend on the amount of any hysteresis H and also the amount of any delay D, as well as the characteristics of the filter arrangement. It will be clear from equation 2 that as the magnitude of the input signal increases, the cycle period $T_{PWM}$ of the PWM signal $S_{PWM}$ will increase, and thus the frequency of the PWM signal $S_{PWM}$ will decrease. The limit cycle period $T_0$ thus corresponds to the shortest cycle period, and hence greatest frequency, for the PWM signal $S_{PWM}$ (for a given set of operating parameters for the TEM 100, e.g. the amount of any hysteresis H or delay D and characteristics of the filter arrangement 102).

In some embodiments, as illustrated in FIG. 4, there may be a cycle period controller (CPC) 401 to control at least one parameter of the TEM 100, such as the amount of any applied hysteresis H and/or the amount of any controlled delay D, so as to control the cycle period of the PWM signal $S_{PWM}$, and hence the output signal $S_{OUT}$, as will be explained in more detail below.

Note that FIGS. 5a to 5e illustrate the value of the filtered signal $S_{FIL}$ ramping in a linear fashion for ease of illustration and description, but in practice, in at least some implementations, the filtered signal $S_{FIL}$ may ramp in a non-linear fashion, for example the exponential decay associated with a passive first order RC filter. It will also be understood by one skilled in the art that FIGS. 5a to 5e are for illustrative purposes only and are not intended to indicate anything about the relative magnitude of variation of the input signal $S_{IN}$, filtered signal $S_{FIL}$ or the pulse durations α, β. In each of the illustrated examples of FIGS. 5a to 5e the level of the input signal $S_{IN}$ is shown as being constant over time. In practice the input signal $S_{IN}$ will be a time-varying signal that includes some information content of interest, for instance the input signal may be an analogue audio signal for example. In use, the TEM 100 may be designed and configured so that the PWM limit cycle frequency is significantly higher than the highest frequency components of interest in the input signal, such that input signal $S_{IN}$ will not vary significantly over each PWM cycle period.

It will be noted that FIG. 4 illustrates that delay element 107, if present, may be located in the forward signal path between the output of comparator 101 and the TEM output for outputting the output signal $S_{OUT}$. In such a case the output signal $S_{OUT}$ is a delayed version of the PWM signal $S_{PWM}$ output from the comparator. It will be understood however that in other implementations the delay element 107 could be located in the feedback path, which would the equivalent of tapping the output signal $S_{OUT}$ from upstream of the delay element 107 illustrated in FIG. 4. In some embodiments there may be more than one delay element to provide an overall controlled delay D and delay elements may be located in the forward path downstream of the comparator 101 and/or in the feedback path.

In some embodiments the TEM 100 is configured such that any signal transitions in the output signal $S_{OUT}$ from the TEM 100 are synchronised to a first clock signal CLK1.

In some embodiments the forward signal path may thus comprise at least one latching element, i.e. a synchronising element, for latching signal transitions in the forward signal path so as to be synchronised to the first clock signal CLK1. In some embodiments the latching element could be associated with the comparator 101 so that the PWM signal $S_{PWM}$ is synchronised to the first clock signal, or the latching element could be downstream of the comparator in the forward signal path, and possibly part of a delay element 107 in the forward signal path. The modulator 100 thus operates so that a rising edge in the output signal $S_{OUT}$, i.e. the beginning of a pulse of the high output state/end of a period of the low output state, is synchronised to the first clock signal CLK1, as is a falling edge, i.e. the end of a pulse of the high output state/beginning of a period of the low output state. This means that the durations α and β of pulses of the high state and low state in the output signal, and also the overall cycle period, will all correspond to integer numbers of periods of the first clock signal CLK1. This can be advantageous when the output PWM signal $S_{OUT}$ is output to a time-decoding converter (TDC) comprising a counter as will be discussed in more detail below.

Figure 6:
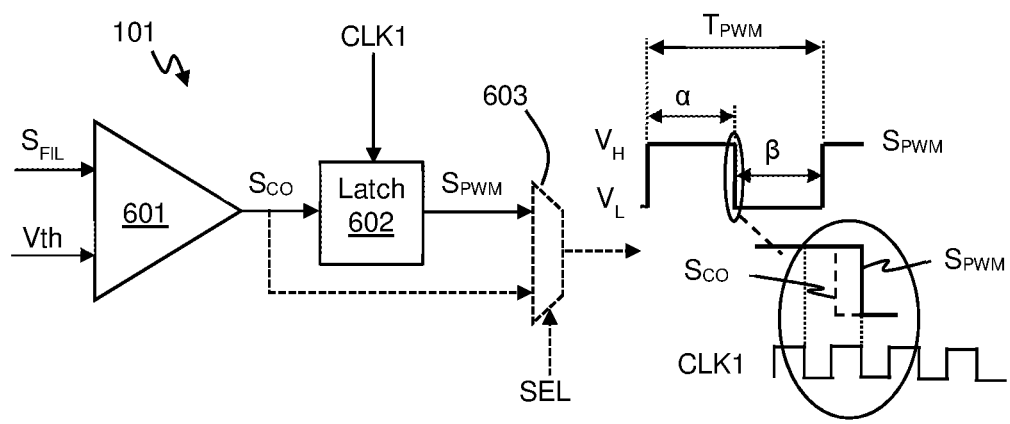
FIG. 6 illustrates one example of a latched comparator arrangement.

In some embodiments the comparator 101 may comprise a latched comparator such that signal transitions in the PWM signal $S_{PWM}$ are synchronised to the first clock signal. FIG. 6 illustrates one example of a possible latched comparator 101. FIG. 6 shows that the latched comparator 101 includes a comparator element 601, which may operate in a similar manner as discussed previously to produce a comparator output $S_{CO}$ which will vary between the two output states, e.g. $V_H$ and $V_L$. The comparator output $S_{CO}$ is supplied to a latch 602 which is clocked by the first clock signal CLK1. In this example the comparator element 603 can transition from one output state to the other output state at any time, based on the comparison of the signals $S_{IN}$ and $S_{FIL}$ at its inputs. However, whenever the output state of the comparator element 601 transitions, i.e. whenever the comparator output $S_{CO}$ changes from $V_H$ and $V_L$ and vice-versa, the latch 602 will maintain its present output state until the next relevant clock edge of the first clock signal CLK1. Thus the corresponding change in state of the output of the latch 602 will be synchronised to the first clock signal CLK1. The latch 602 is thus effectively configured to sample the comparator output $S_{CO}$ at sampling times defined by the first clock signal CLK1 and to maintain that value as its output until the next sample time.

FIG. 6 also illustrates the general form of the waveform of the time-encoded signal $S_{PWM}$ which is generated at the output of the latched comparator 101. FIG. 6 illustrates, in an expanded form, an example of a possible relationship between the signal $S_{PWM}$ output from the latched comparator 101 and the intermediate signal $S_{CO}$ of the comparator element 601 when transitioning from the high output state to the low output state. In this example the latch 602 may sample the intermediate signal $S_{CO}$ output from the comparator element 601 at times defined by a falling edge of the first clock signal CLK1. It can be seen that at a first sample time defined by a falling edge of the first clock signal CLK1, the signal $S_{CO}$ from the comparator element 601 is still in the high state and so the latch 602 maintains its output in the high state. Subsequently, before the next sample time, the signal $S_{CO}$ from the comparator element 601 changes state, as indicated by the dashed line. However the latch 602 maintains its output in the high state until the next sample time. At this point the latch 602 samples the intermediate comparator signal $S_{CO}$ and switches to the low output state.

It will be appreciated that constraining the time-encoded signal $S_{PWM}$ which is output from the TEM 100 to change state at a time synchronised to the first clock signal CLK1 will result in the durations α and β possibly being different from what they might otherwise have been, introducing a quantisation error. However it will be noted that the feedback signal $S_{FB}$ is derived from the synchronised time-encoded signal $S_{OUT}$. Any such quantisation error thus occurs within the feedback loop of the TEM 100, which provides some noise shaping. Noise shaping will be present in both the first and second operating modes, but for the first mode of operation, the higher loop gain of the filter arrangement 102 configured as an active filter will provide better noise shaping.

Referring to FIG. 6, the operation of the latch 602 can be seen as adding some variable delay between when the output of the comparator element 601 would transition (based on the inputs to the comparator element 601) and when the PWM signal $S_{PWM}$ actually transitions. This variable delay due to latching is in addition to any controlled delay for a defined delay period D applied by a delay element 107 if present. This variable delay can be seen as introducing an error in the duration of the relevant pulse, e.g. in the duration α by extending the duration. However, as will be clear from FIGS. 5c and 5d, an extended duration for the pulse a will result in the filtered signal $S_{FIL}$ ramping a bit lower than it otherwise would have done before the state of the feedback signal $S_{FB}$ changes, which will mean that the filtered signal $S_{FIL}$ will then have to ramp-up further for the comparator output to transition again, thus also extending the duration β. It can therefore be seen that the error introduced by extending the duration α to synchronise with a clock edge of the first clock signal CLK1 is, in effect, carried forward into determination of the duration β in a way that acts to maintain the duty cycle. A similar effect would occur if the PWM signal $S_{PWM}$ were not synchronised to the first clock signal CLK1 but instead the synchronising were applied by a delay element 107. Again any quantisation error would be within the feedback loop.

By introducing the quantisation error within the loop of the time-encoding modulator 100 in this way, the TEM 100 thus provides noise shaping in a similar way as discussed above in relation to a VCO based TDC, but provides a time-encoded signal $S_{OUT}$ which is synchronised to a first clock signal. This means that the durations of pulses of the time encoded signal $S_{OUT}$ can be supplied directly to a counter which is synchronised to the first clock signal to provide count values without introducing any quantisation error due to the count.

It should be noted that the comparator element 601 and latch 602 have been illustrated as separate components for ease of description, and in some embodiments the latch 602 may indeed be a separate component to a comparator element 601. In some embodiments the latching element may be a latch which is separate to comparator 101 and downstream of the output of the comparator 101. In some embodiments a delay element 107, located in the path between the output of the comparator 101 and the modulator output for outputting the output signal $S_{OUT}$, may including a latching element that provide a similar function to latch 602 as part of the delay. In some implementations however the comparator and latch functions may be combined as a latched comparator such that there may not be a separate intermediate signal $S_{CO}$. There are various ways in which a latched comparator 101 could be implemented. One skilled in the art will be well aware of how to implement a latched comparator 101 in which transitions in the output time-encoded signal $S_{PWM}$ are synchronised to a clock signal. For example some circuits are pre-set to a meta-stable state and then released on one edge of each period of a clock signal to make a comparison decision.

It will thus be appreciated that the output from the latch 602, and hence from the latched comparator 101, will still be a PWM signal with cycle-by-cycle durations of α and β of the first and second output states, but in this case the durations α and β and hence the overall cycle period $T_{PWM}$ will be integer multiples of the period of the first clock signal CLK1.

In some implementations the latching functionality to synchronise the PWM signal $S_{PWM}$ to the first clock signal may be selectively enabled or disabled. In some implementations the latching functionality may be enabled in the first mode of operation but may be disabled in the second mode of operation so as to reduce power consumption in the second mode of operation. In some instances the latching element, e.g. latch 602, may be operable in a pass-through mode, or in some implementations there may be a signal selector, such as a multiplexor 603 which may be operable to receive the output of the comparator element 601 directly and also operable to receive the output of latch 602 and pass a selected one of these inputs as the output PWM signal based on a signal select control signal, SEL, which may be controlled depending on the mode of operation. The latch 602 may be disabled when not in use.

In embodiments where the PWM signal $S_{PWM}$ received by a delay element 107 is synchronised to the first clock signal CLK1, the delay element 107 may comprise a digital delay that is also clocked by the first clock signal CLK1. The delay element 107 may thus receive the PWM signal $S_{PWM}$ and delay propagation of any change in state of the PWM signal $S_{PWM}$ for a defined number of periods of the first clock signal CLK1 to provide a desired delay. Thus the delayed signal will also be synchronised to the first clock signal CLK1. Such a digital delay, which is clocked by a clock signal so as to provide a delay for a controlled number of periods of the clock signal, can be readily implemented by relatively small and lower power circuitry to provide a controlled and accurate delay. The duration of the delay D may be defined by setting the number of clock periods for which the digital delay element 107 will delay any propagation of a change in state of its input to a change in state in its output.

Synchronising the output PWM signal $S_{OUT}$ from the time-encoding modulator (TEM) 100 to the first clock signal CLK1 can provide advantages for the downstream processing of the output signal $S_{OUT}$.

In various embodiments the PWM output signal $S_{OUT}$ may be received by a time-decoding converter (TDC) to convert the PWM signal to a digital signal. For example, as mentioned above with respect to FIG. 3, the TEM 100 may be used with a suitable TDC as part of an analogue-to-digital converter (ADC) 300.

Figure 7:
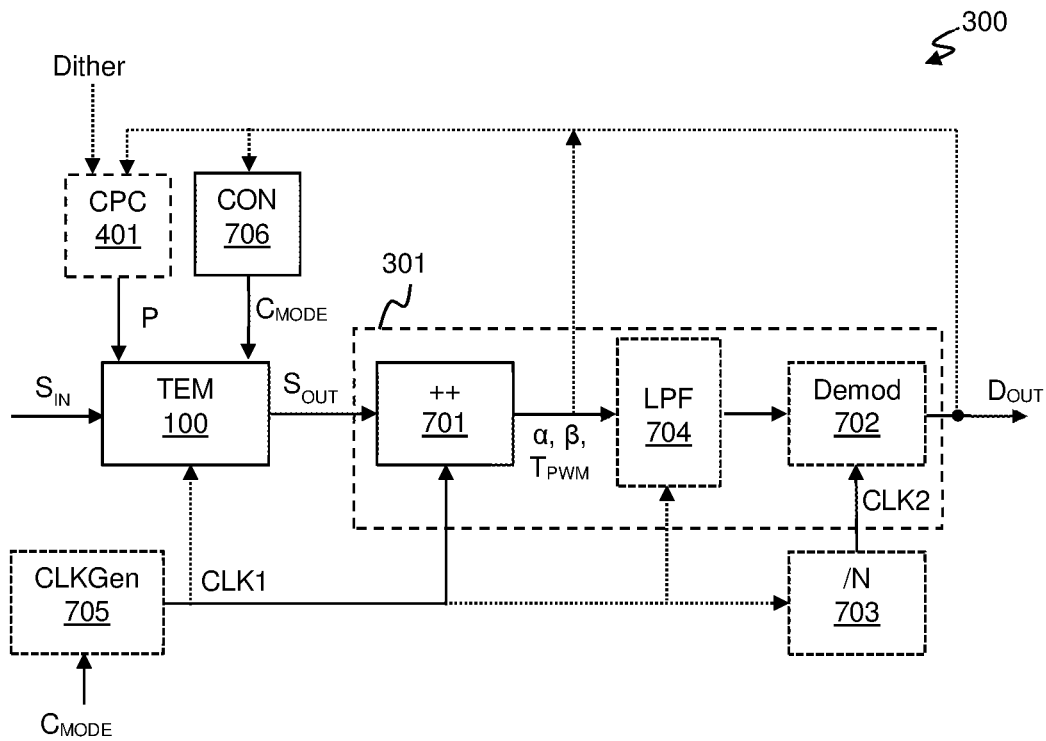
FIG. 7 illustrates one example of an ADC comprising a TEM according to an embodiment in more detail.

FIG. 7 illustrates one example of an ADC 300 including a time-encoding modulator (TEM) 100 according to embodiments in more detail. FIG. 7 illustrates that the TEM 100 receives the input signal $S_{IN}$. The output signal $S_{OUT}$ from the TEM 100 is received by a time-decoding converter (TDC) 301. The TDC 301 includes a counter 701 which is clocked by a counter clock signal. In embodiments where a first clock signal CLK1 is supplied to the TEM 100, so that the TEM 100 can synchronise the output signal $S_{OUT}$ to the first clock signal in at least one operating mode, the counter clock signal may be, or may be a version of, the first clock signal CLK1 as illustrated.

The counter 701 may be configured to produce a count value of the number of clock periods of the counter clock signal CLK1 in a periods defined by the durations α and β of the pulses of the output PWM signal $S_{OUT}$ so that an indication of the duty cycle can be determined, e.g. by a demodulator 403 as a value $\alpha/(\alpha+\beta)$ or $(\alpha-\beta)/(\alpha+\beta)$.

If the durations α and β of the pulses of the output PWM signal $S_{OUT}$ are not synchronised to the counter clock signal, there could be a quantisation error associated with these count values. The extent of such a quantisation error would be determined by the time resolution of the counter 701, which would depend on the frequency of the counter clock signal CLK1. Thus, for example, if the counter clock signal CLK1 had a frequency of, say, 100 MHz, the difference between a count value of M and a count value of M+1 corresponds to a difference in time of 10 ns and thus the minimum time resolution of the TDC 401 would be 10 ns. The resulting quantisation noise spectrum of a purely counter based TDC is effectively flat. To provide an output with acceptably low quantisation noise in the first mode of operation, the frequency of the counter clock signal supplied to the counter 701 in the first mode of operation may be relatively high, for example of the order of several GHz. However such a fast clock speed may be undesirable for power and practicality reasons for some applications.

In some embodiments of the present disclosure, the TEM 100 receives the first clock signal CLK1 and, as described previously, in at least the first mode of operation, synchronises any signal transitions in the output time-encoded signal $S_{OUT}$ to the first clock signal. Thus, as mentioned, the durations $\alpha$ and $\beta$ of the pulses of the PWM signal $S_{OUT}$ will correspond to integer number of periods of the first clock signal CLK1. As such the counter 701 of the TDC 301 can determine count values for these periods without introducing any quantisation error at all.

FIG. 7 illustrates a single counter 701. The counter may be arranged to count during each pulse of the time-encoded signal $S_{OUT}$, high or low, and reset at the end of each pulse. In some implementations the counter 701 may be provided by first and second counter elements (not illustrated). The first counter element may be configured to count during a period of the first output state of the time-encoded signal $S_{OUT}$, e.g. to determine a count value for $\alpha$, with the second counter element being configured to count during a period of the second output state, e.g. to determine a count value for $\beta$. Other arrangements are possible however.

As mentioned the level of the input signal $S_{IN}$ is encoded by the duty cycle of the pulses in the time-encoded signal $S_{OUT}$ and may be decoded as $(\alpha-\beta)/(\alpha+\beta)$ or as $\alpha/(\alpha+\beta)$ for example. Providing separate counts for $\alpha$ and $\beta$ allows the desired demodulation to a digital value to be performed and values such as $\alpha-\beta$ or $\alpha-\beta$ can be readily determined. However, in some arrangement the counter could also be arranged to provide a count of the cycle period $T_{PWM}$, i.e. a count directly of $\alpha+\beta$. Additionally or alternatively an up-down counter could be arranged to increment during the pulse of one output state and decrement during the pulse of the other output state to provide a count value indicative of $\alpha-\beta$.

The count values, which in this example may be the count values $\alpha$ and $\beta$, may be provided to a demodulator 702 for conversion to a digital output, e.g. as $(\alpha-\beta)/(\alpha+\beta)$ or as $\alpha/(\alpha+\beta)$, which digital value may be output as a digital output signal $D_{OUT}$. In some implementations the demodulator may comprise an asynchronous sample rate converter (ASRC) to provide a regular sample rate, although in some implementations an ASRC may be provided downstream or may not be required.

There are various known ways in which the count values could be demodulated to provide the digital output. For example the demodulation may be achieved in a computationally efficient way through use of a sigma-delta modulator (SDM).

The demodulator 702 may provide output signal DOUT at a sample rate defined by a demodulator clock CLK2 which is of lower frequency than the first clock signal CLK1, to which the time-encoded signal is synchronised. Conveniently the demodulator clock signal CLK2 used to control the demodulator(s) may be synchronised to the first clock signal CLK1. The clock signal CLK2 may conveniently be derived from the first clock signal CLK1, e.g. by frequency divider 703. The demodulator 702 may thus be clocked at a lower clock rate than the counter 701 of TDC 301. Operating a lower clock rate may result in some of the power of higher frequency components folding down into the signal band of interest and increasing the noise with the signal band. In some implementations therefore a TDC filter arrangement 704 may be arranged to provide filtering of the count values $\alpha$ and $\beta$ for anti-aliasing. The TDC filter arrangement 705 may be a low-pass filter (LPF) applying low-pass filtering to the count values $\alpha$ and $\beta$ in any convenient way.

The ADC 300 may thus be operable in at least two modes of operation, corresponding to the modes of operation of the TEM 100. In the first mode of operation the ADC 300 may be operable with relatively high quality. In some embodiments, in the first mode of operation the TEM 100 may be arranged to receive the first clock signal and to synchronise any signal transitions in the output time-encoded signal $S_{OUT}$ to the first clock signal. In the first mode, the first clock signal CLK1 may thus have a first frequency f1, which may for example be of the order of a few hundred megahertz, say around 300 MHz for example. The counter 701 of TDC 301 may also be synchronised to the first clock signal CLK so that the counter 702 does not introduce any quantisation noise. The count values may be demodulated by demodulator 702 to provide a digital output $D_{OUT}$.

In the second mode of operation, the TEM 100 again operates to provide the output time-encoded signal $S_{OUT}$, but in the second mode the TEM 100 has a lower power consumption than in the first mode. In some embodiments the TEM 100 also receives the first clock signal CLK1 in the second mode and may synchronise the time encoded output to the first clock signal. However in some embodiments the TEM 100 may be operable so that the output PWM signal $S_{OUT}$ is not synchronised to a clock signal in the second mode of operation as this may provide further power savings. The time encoded signal $S_{OUT}$ output from the TEM 100 may be provided to the counter 701 of TDC 301 which may again count the number of clock periods of the first clock signal CLK1 in periods defined by the output PWM signal $S_{OUT}$. If the output time encoded signal $S_{OUT}$ is not synchronised to the first clock signal, the count may introduce quantisation noise, but this may be acceptable for the second mode of operation. In some embodiments, in the second mode of operation the first clock signal CLK1 may have a second frequency f2, which is different to, and lower than, the first frequency f1. In some examples, e.g. where the second mode is mainly used for activity detection, the frequency in the second mode of operation may be of the order of a few hundred kilohertz or so.

In other words the frequency of the first clock signal CLK1 may be reduced in the second mode so as to provide additional power savings. In some embodiments the ADC may thus be configured to receive the first clock signal from a clock generator 705, which may be operable to provide the first clock signal at different frequencies responsive to a mode control signal $C_{MODE}$. In some embodiments the clock generator 705 may comprise a TEM configured to receive a defined voltage as an input signal.

In some embodiments the ADC 300 may operate to provide a digital output $D_{OUT}$ in the second mode and thus the count values from the counter 701 may be demodulated by demodulator 702 as described above. In some implementation however, the count values produced by the counter 701 may be sufficient for the particular application.

For instance, in some implementation the ADC 300 may be operated in the second mode, to provide some low power always-on type functionality for detecting any significant signal activity. Once any signal activity is detected, the ADC 300 may be switched to the first mode so as to provide a higher quality digital output for subsequent processing. In such a case it may be possible to detect signal activity based on the count values alone, in which case in the second mode of operation the demodulator 702 may be substantially unpowered.

As mentioned above the pulse durations α and β and also the PWM cycle period $T_{PWM}$ will vary with the level of the input signal. For input signals of zero magnitude the pulse durations α and β will be equal and each equal to half the limit cycle period $T_0$. As the input signal magnitude increases the relative durations α and β will vary, as will the overall cycle period. If the expected limit cycle period $T_0$ is known for the TEM 100 when operating in the second mode, a count value corresponding to α or β, or the sum or difference between α and β, or a direct count of the overall cycle period, could be monitored against a threshold. If the relevant value remains below the threshold this indicates that the input signal $S_{IN}$ is below some magnitude limit. If however the monitored value increase above the threshold, this indicates that the input signal $S_{IN}$ has increased the magnitude limit, in which case the ADC 300 may change to the first mode of operation.

In some embodiments the ADC 300 may therefore comprise a mode controller 706 for controlling the mode of operation of the TEM 100 and the ADC 300. The mode controller may receive at least some count values directly from the counter 701 and/or may receive a digital output from the demodulator 702 when active. The mode controller 706 may determine an appropriate mode of operation based on the count values and/or the digital output $D_{OUT}$ and may operate in the second mode when there is no significant signal activity and then transition to the first mode when significant activity when detected. Following any defined period of inactivity the mode controller 706 may transition back to the second mode of operation. Additionally or alternatively the mode controller 706 may be responsive to some external control signals to implement a particular mode of operation. As noted above in some embodiments the mode controller 706 may also generate a mode control signal to vary the frequency of the counter clock signal CLK1 and/or to enable or disable the demodulator 702 of the TDC 301.

In some embodiments a cycle period controller (CPC) 401 may be configured to control at least one parameter P of the TEM 100 so as to control the cycle period, and hence frequency of the PWM output signal $S_{OUT}$ from the TEM 100. As described above, not only do the durations α and β of the pulses of high and low state in the PWM signal $S_{PWM}$ (and consequently the output signal $S_{OUT}$) vary with the level of the input signal $S_{IN}$ but also with the PWM cycle period $T_{PWM}$, and hence PWM cycle frequency $f_{PWM}$, also vary with the input signal $S_{IN}$. The PWM cycle period $T_{PWM}$ can increase significantly at higher input signal magnitudes. For instance at a signal magnitude of nine tenths of the maximum signal level, (|X|=0.9), if can be seen from equation (2) the cycle period will be over five times longer than the limit cycle period $T_0$ at X=0. The PWM cycle frequency $f_{PWM}$ will thus be over five times lower than the limit cycle frequency $f_0$.

This relatively large variation in cycle frequency or period of the output signal $S_{OUT}$ may be disadvantageous in some implementations. For instance any downstream time-decoding components may need to be able to cope with a large range of cycle period, which may add to the complexity of such decoding components. In addition, to ensure that cycle frequency remains sufficiently high at all signals levels may require the limit cycle frequency to be very high, which again may add to the complexity of downstream components. Otherwise, as the cycle frequency reduces at higher signal magnitudes, it could approach the signal band of interest.

To avoid these issues the operation of the time-encoding modulator 100 may be controlled so as to control the cycle period or cycle frequency of the output signal $S_{OUT}$. In some embodiments the cycle period controller 401 may, in at least the first operating mode, be adaptive and respond to an indication of the level of the input signal $S_{IN}$ to maintain the cycle period of the PWM signal $S_{PWM}$ and hence the output signal $S_{OUT}$ within a set range. In particular the cycle period controller 401 may be configured, in at least the first mode of operation, to control at least one parameter P of TEM 100 based on the output signal $S_{OUT}$. In some embodiments the cycle period controller 401 may receive a count values, e.g. counts corresponding to some α and/or β or some combination thereof from counter 701 and/or an indication of the digital output from demodulator 702. In some embodiments, as illustrated in FIG. 4, a cycle period controller 401 could be configured to receive the output time-encoded signal $S_{OUT}$ itself, in which case the cycle period controller may comprise a counter or TDC (not separately illustrated) to determine an indication of the magnitude of the input signal or indication of the present PWM cycle period $T_{PWM}$. The cycle period controller may be configured to control at least parameter of the TEM 100 so as to control the cycle period.

In some implementations the at least one parameter controlled by the cycle period controller 401 may comprise an amount of hysteresis H applied by the comparator 101. If the magnitude of the input signal $S_{IN}$ increases, which would tend to lead to a longer PWM cycle period $T_{PWM}$, the cycle period controller 401 may reduce the amount of hysteresis H applied so as to maintain the overall PWM cycle period $T_{PWM}$ within defined limits. There are various ways in which a comparator 101 could be implemented with a controllable hysteresis.

Additionally or alternatively, in some implementations the at least one parameter controlled by the cycle period controller 401 may comprise an amount of controlled delay D applied by a delay element 106, which may be a variable delay element operable to provide a defined delay that may be selectively varied in a known way. Thus, if the magnitude of the input signal $S_{IN}$ increases, which would tend to lead to a longer PWM cycle period $T_{PWM}$, the cycle period controller 401 may reduce the amount of delay D applied so as to maintain the overall PWM cycle period $T_{PWM}$ within defined limits.

There are various ways in which a controlled delay may be implemented and in which the controlled delay applied may be controllably variable. In some embodiments the comparator 101 of the TEM 100 may be operable to apply hysteresis to the comparison and there may be a variable delay element 106 in the feedback loop of the TEM, in which case the cycle period controller may be operable to control both the applied hysteresis H and the controlled delay D.

In some embodiments the delay and/or hysteresis may be controlled to control the variation in the PWM cycle frequency $f_{PWM}$ in operation. In some embodiments the delay D and/or hysteresis H may be controlled to implement different operating modes as discussed above.

It will be appreciated that the PWM cycle period $T_{PWM}$ for the PWM signal $S_{PWM}$ for a given magnitude of input signal $S_{IN}$ will also depend on the ramp rate of the filtered signal $S_{FIL}$ for the given input signal, which depends at least partly on the filter parameters of the filter arrangement 105 in the relevant configuration. Additionally or alternatively therefore the at least one parameter P of the TEM 100 controlled by the cycle period controller 401 may comprise a filter parameter of the filter arrangement 102. For instance in the first mode of operation a gain factor of the integrator 202 could be controllably varied, for example by varying the value of component resistances and/or capacitances. One skilled in the art will be aware of various filter parameters that could be varied for the relevant filter so as to controllably vary the ramp rate of the filtered signal.

Embodiments of the present disclosure thus relate to a TEM 100 that can be used as part of an ADC 300 and which can be operated in at least two different modes, wherein a filter arrangement 102 of the TEM 100 can be reconfigured in the two operating modes so as to provide a first higher quality, but higher power and a second lower power, but lower quality mode. In at least one operating mode, e.g. the first operating mode, the output time encoded signal may be synchronised to a received first clock signal, which may relay requirements for downstream processing. In at least one operating mode, e.g. the first operating mode, one or more parameters of the TEM may be controlled to control the cycle period of the time encoded signal.

In the example of FIG. 4 the configurable filter arrangement 102 may be configured as an active integrator for filtering the combined input signal $S_{IN}$ and feedback signal $S_{FB}$, such as illustrated in FIG. 2a, in the first mode and may be reconfigured to a passive filter for filtering the combined input signal $S_{IN}$ and feedback signal $S_{FB}$, such as illustrated in FIG. 2b in the second mode. As noted above however in some embodiments a variant second operating mode may be implemented in which the feedback signal $S_{FB}$ is filtered to provide the filtered signal for one input of the compactor 101 whilst the input signal is provided to the other input of comparator 101, such as illustrated in FIG. 2c.

Figure 8A:
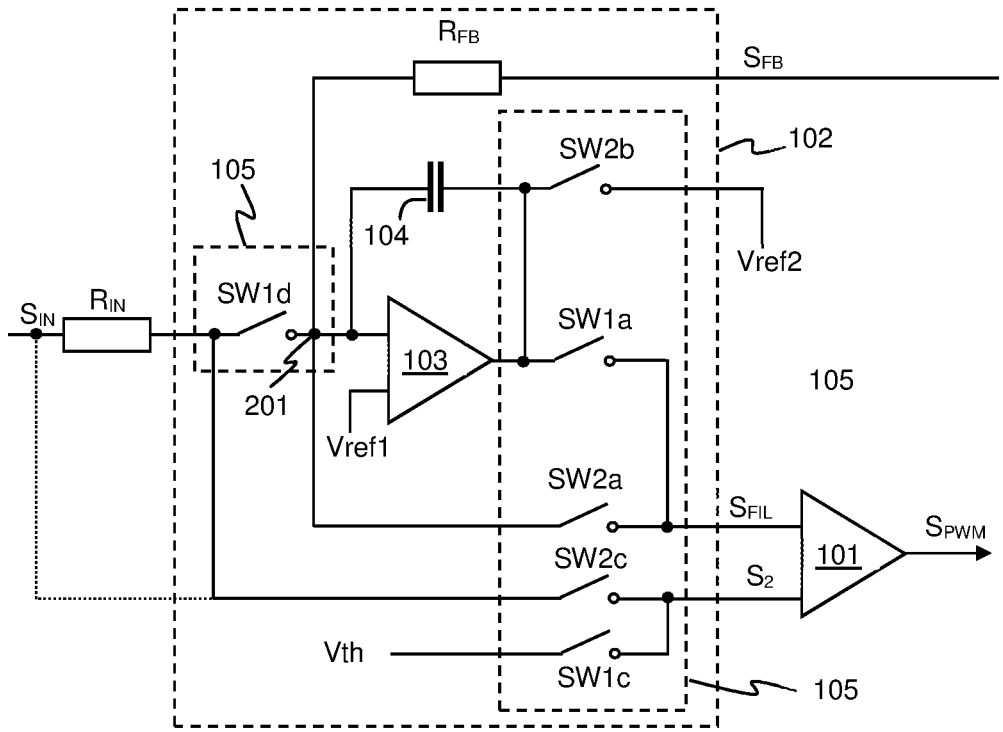
FIGS. 8a and 8b illustrates additional examples of alternative filter arrangements for a time-encoding modulator according to an embodiment.

FIG. 8a illustrates one example of a filter arrangement 102 that may be reconfigured between a first operating mode such as illustrated in FIG. 2a and a second operating mode such as illustrated in FIG. 2c. In this example the switch network 105 comprises the switches SW1a, SW2a and SW2b as described above with reference to FIG. 4. In addition the switch network includes switches SW1c, SW1d and SW2c. Switch SW1c is closed in the first mode of operation to provide the threshold signal Vth to the second input of comparator 101. In the second mode of operating switch SW1c is opened and switch SW2c closed so as to supply the input signal to the second comparator input. As noted above as the second input to the comparator 101 may be high-impedance the input signal could, in the second operating mode, be tapped from before or after input resistance $R_{IN}$. Switch SW1d is opened in the second operating mode to isolate the input signal from the first op-amp 103. As discussed in relation to FIG. 4, switch SW2b may be omitted if the op-amp 103 is operated in the second mode to provide clamping.

Figure 8B:
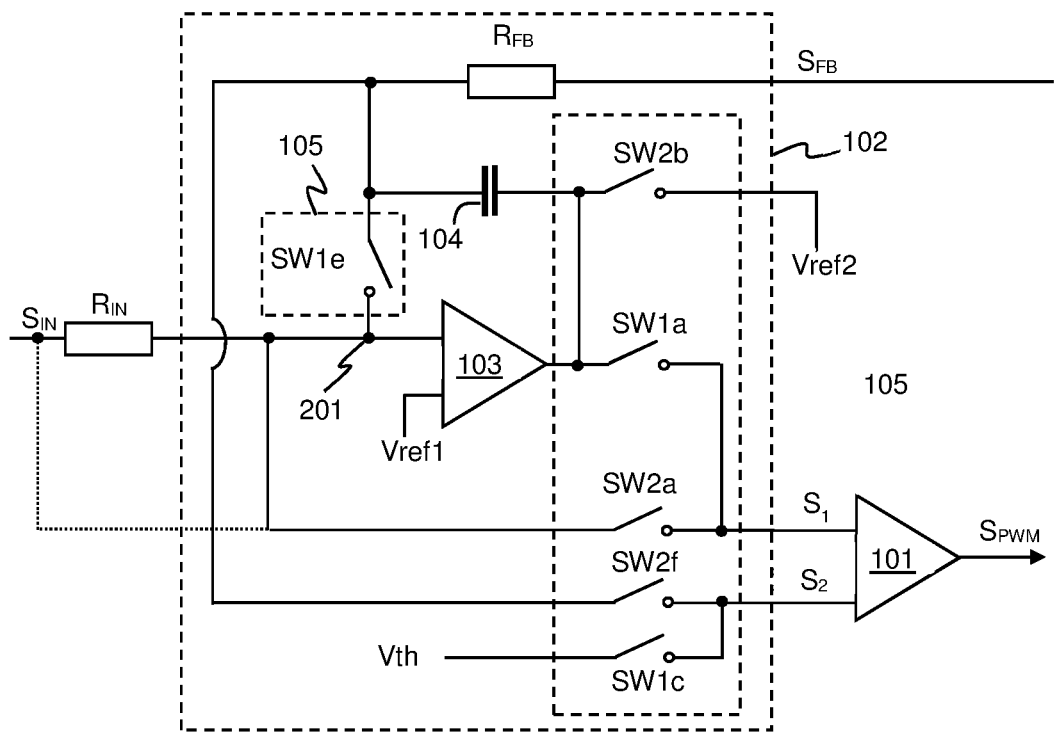

FIG. 8b illustrates another example of a filter arrangement 102 that is configurable in a first mode to provide an active integrator filter for the combined input signal $S_{IN}$ and feedback signal $S_{FB}$, and configurable in the second mode to provide the input signal $S_{IN}$ to one input of comparator and a filtered signal $S_{FIL}$ derived from the feedback signal $S_{FB}$ to the other input of comparator 101. In the embodiment of FIG. 8b however a first comparator input receives the filtered signal in the first mode, with a second comparator input coupled to a threshold signal, whilst in the second mode it is the second comparator input that receives the filtered feedback signal whilst the first comparator input receives the input signal. This arrangement addresses the issue that the active filter in the first mode is inverting and the passive filter of the second mode is non-inverting by swapping the inputs to the comparator 101 between modes. This avoids the need for a selective inverter 106, but does mean that the polarity of the output signal $S_{OUT}$ may vary in the two operating modes.

The switch network 105 of the filter arrangement 102 of FIG. 8b includes switches SW1a, SW1c SW2a and SW2b as described previously. In addition the switch network includes switches SW1e, SW1f and SW2f. Switch SW1c is closed in the first mode of operation to provide the threshold signal Vth to the second input of comparator 101. In the second mode of operating switch SW1c is opened, as is switch SW1e to isolate the feedback signal $S_{FB}$ from the signal path for the input signal $S_{IN}$. Switch SW2f is closed to couple the filtered signal to the second comparator input.

Other arrangements are possible however, in particular in at least one mode the filter arrangement may be implemented as an active and/or passive second or higher order filter.

Figure 9:
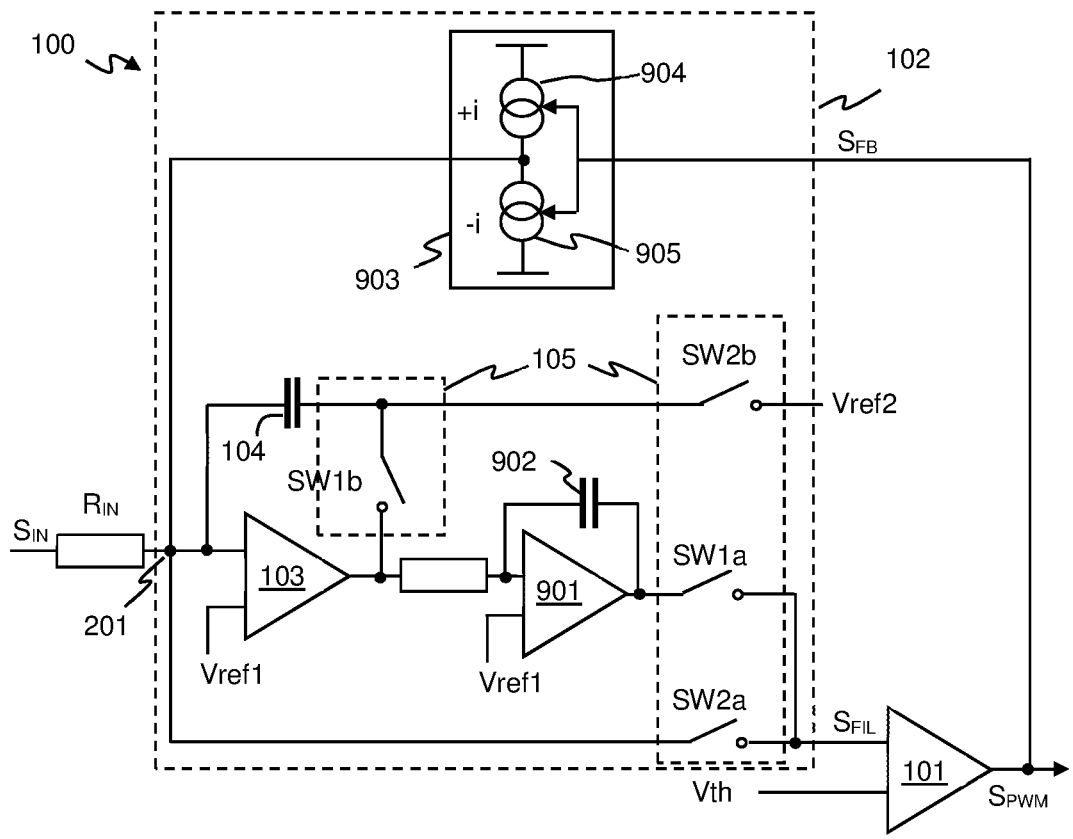
FIG. 9 shows a further example of a time encoding modulator.

FIG. 9 illustrates a further example of a TEM 100 according to an embodiment in which similar components are identified using the same reference numerals. FIG. 9 illustrates that the filter arrangement 102 additionally comprises a second op-amp 901 and a second capacitance 902 coupled to the switch network 105. The switch network 105 is configured such that, in the one operating mode, the second op-amp 901 and second capacitance 902 may be configured, together with the first op-amp 103 and first capacitance 104, as a second order active filter, in this case a second order integrator. In this example the first mode is enabled by enabling the first and second op-amps 103 and 901 and closing switch SW1a and switch SW1b and opening switches SW2a and SW2b. The second mode is enabled by closing switch SW2a to connect the first node 201 to the comparator 101 in a path that bypasses the first and second op-amps 103 and 901, and closing switch SW2b to connect one of the capacitances (in this example the first capacitance 104) between the first node 201 and the reference voltage Vref1, with switches SW1a and SW1b open.

In some embodiments, if desired, a further mode of operation could be enabled by appropriate switches so as to allow the filter arrangement to be configured as a first order filter using just one of the op-amps. It will of course be appreciated that higher order filters could also be implemented in at least some operating modes if desired.

It will be understood that FIG. 9 shows the output of the comparator 101 being used directly as the output signal $S_{OUT}$ without any separate delay 107, and the comparator 101 may thus be a hysteretic comparator, but it will be appreciated that a delay could be included in some embodiments. FIG. 9 omits a selective inverter but likewise a selective inverter could be included as discussed previously if required, for example with other topologies of second-order or higher-order filters depending on the polarity of the filter input-output transfer function.

In some embodiments the feedback path may include a controllable current generator which is configured to generate defined currents based on the state of the feedback signal. Such a current generator may be used instead of applying the feedback signal via a feedback resistance $R_{FB}$. FIG. 9 thus shows that the feedback path may include a current generator 903, which generates a steering current of a defined magnitude but opposite polarity based on the state of the feedback signal $S_{FB}$. For example the current generator 903 may have a first current element 904 arranged as a current source to provide a positive steering current +i when the feedback signal is in one output state and a second current element 905 arranged as a current sink to provide a negative steering current when the feedback signal is in the other output state. This steering current will (in this example) be combined, at the first node, with the current generated by the input signal $S_{IN}$.

One practical advantage of the use of a current generator 903 is that avoids the need for voltage buffers to provide accurate voltage levels $V_H$ and $V_L$ in order for example to avoid the effects of power supply voltage variation. Such buffers need to be well designed in order to avoid transient effects as the feedback load is switched from $V_H$ to $V_L$ and vice-versa and thus may require more power and chip area than required for a simple current source whose output may be simply steered from the output node to some other node. It will be appreciated that the use of a current generator in the feedback path could also be applied to the other embodiments described.

Figure 10:
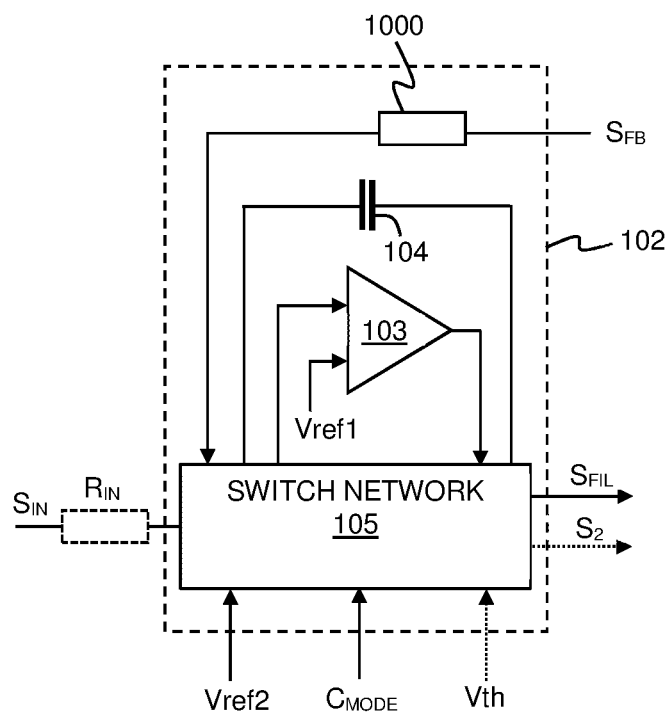
FIG. 10 illustrates generally one example of a reconfigurable filter arrangement.

Embodiments of the present disclosure thus relate to a TEM which is operable in at least first and second modes. The TEM includes a reconfigurable filter arrangement that can be configured in one operating mode to act as an active filter, for higher quality operation, and in another mode may be configured in another operating mode to act as a passive filter, for lower power operation. Aspects also relate to such a reconfigurable filter, such as illustrated in FIG. 10. The reconfigurable filter may include at least one op-amp 103 and at least on capacitance 104. There may also be a current conversion apparatus 1000, such as a resistance or a steerable current generator for generating a current signal based on a received feedback signal $S_{FB}$.

Embodiments may be implemented in a range of applications and in particular are suitable for audio or ultrasonic applications. Embodiments may be implemented as part of an ADC circuit and may in particular be suitable for applications requiring the ability to provide low power operation at times but higher quality operation at other times. In particular embodiments may be implemented as part of a signal path which is operable with always-on functionality and may be usefully employed as part of signal path for receiving voice commands.

Embodiments may be implemented as an integrated circuit which in some examples could be a codec or audio DSP or similar. Embodiments may be incorporated in an electronic device, which may for example be a portable device and/or a device operable with battery power. The device could be a communication device such as a mobile telephone or smartphone or similar. The device could be a computing device such as notebook, laptop or tablet computing device. The device could be a wearable device such as a smartwatch. The device could be a device with voice control or activation functionality. In some instances the device could be an accessory device such as a headset or the like to be used with some other product.

The skilled person will recognise that some aspects of the above-described apparatus and methods, for example the discovery and configuration methods may be embodied as processor control code, for example on a non-volatile carrier medium such as a disk, CD- or DVD-ROM, programmed memory such as read only memory (Firmware), or on a data carrier such as an optical or electrical signal carrier. For many applications, embodiments will be implemented on a DSP (Digital Signal Processor), ASIC (Application Specific Integrated Circuit) or FPGA (Field Programmable Gate Array). Thus the code may comprise conventional program code or microcode or, for example code for setting up or controlling an ASIC or FPGA. The code may also comprise code for dynamically configuring re-configurable apparatus such as re-programmable logic gate arrays. Similarly the code may comprise code for a hardware description language such as Verilog™ or VHDL (Very high speed integrated circuit Hardware Description Language). As the skilled person will appreciate, the code may be distributed between a plurality of coupled components in communication with one another. Where appropriate, the embodiments may also be implemented using code running on a field-(re) programmable analogue array or similar device in order to configure analogue hardware.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope.

The invention claimed is:

1. A time encoding modulator apparatus comprising:
an input for receiving an input signal and an output for outputting an output signal;
a filter arrangement configured to receive the input signal and a feedback signal from the output and generate a filtered signal based at least in part on the feedback signal; and
a comparator configured to receive the filtered signal and output a time-encoded signal based at least in part on the filtered signal,
wherein the time encoding modulator is operable in a first mode with the filter arrangement configured as an active filter and in a second mode with the filter arrangement configured as a passive filter; and
wherein the output signal is based on the time-encoded signal.

2. The time encoding modulator apparatus as claimed in claim 1 wherein the filter arrangement comprises a first operational amplifier which is enabled in the first mode and disabled in the second mode.

3. The time encoding modulator apparatus as claimed in claim 2 wherein the filter arrangement comprises a first capacitance and a switch network, the switch network comprising a plurality of switches operable to establish different signal paths via the filter arrangement in said first and second modes.

4. The time encoding modulator apparatus as claimed in claim 3 wherein, in the first mode, the filter arrangement is configured with the first capacitance coupled across the first operational amplifier.

5. The time encoding modulator apparatus as claimed in claim 3 wherein, in the second mode, the filter arrangement is configured such that the feedback signal is supplied to a first node of the filter arrangement and the first capacitance is coupled between said first node and a defined voltage reference.

6. The time encoding modulator apparatus as claimed in claim 5, wherein, in the second mode, the filter arrangement is configured such that the first node is coupled to one input of the comparator, such that the filtered signal depends on the feedback signal, and the input signal is supplied to another input of the comparator such that the comparator is configured to compare the filtered signal to the input signal.

7. The time encoding modulator apparatus as claimed in claim 5 wherein, in the second mode, an output stage of the first operational amplifier is controlled to provide said defined voltage reference.

8. The time encoding modulator apparatus as claimed in claim 5, wherein, in the second mode, the filter arrangement is configured such that the input signal is combined with the feedback signal at the first node such that the filtered signal depends on the combined input signal and feedback signal, and wherein the comparator is configured to compare the filtered signal to at least one defined threshold.

9. The time encoding modulator apparatus as claimed in claim 8 wherein the filter arrangement is configured such that in the first mode the filtered signal is supplied to a first comparator input of the comparator, with a second comparator input of the comparator coupled to a threshold signal, and in the second mode the filtered signal is supplied to the second comparator input and the input signal is supplied to the first comparator input.

10. The time encoding modulator apparatus as claimed in claim 2 wherein, in the first mode, the filter arrangement is configured such that the input signal is combined with the feedback signal and supplied to an input of the first operational amplifier such that the filtered signal depends on the combined input signal and feedback signal and wherein the comparator is configured to compare the filtered signal to at least one defined threshold.

11. The time encoding modulator apparatus as claimed in claim 1 wherein the time encoding modulator apparatus comprises a controlled inverter for selectively inverting the time-encoded signal output from the comparator in one of the first and second modes and not in the other of said first and second modes.

12. The time encoding modulator apparatus as claimed in claim 1 wherein the comparator is a hysteretic comparator and wherein the hysteresis applied by the hysteretic comparator is controllably variable and the time encoding modulator apparatus is configured such that hysteresis applied is different in the first and second modes.

13. The time encoding modulator apparatus as claimed in claim 1 wherein the time encoding modulator apparatus comprises a delay element configured to apply a delay between a change in state of the time-encoded signal and a corresponding change in state of the feedback signal and wherein the delay applied by the delay element is controllably variable and the time encoding modulator apparatus is configured such that delay applied is different in the first and second modes.

14. The time encoding modulator apparatus as claimed in claim 1 wherein the filter arrangement is configured such that, in the first mode, the active filter is a second order or higher order filter.

15. The time encoding modulator apparatus as claimed in claim 1 further comprising a mode controller for selectively controlling operation in the first mode or the second mode, wherein the mode controller is configured to control operation of the time-encoding modulator circuit in the first mode or the second mode based on the output signal.

16. A circuit comprising a time encoding modulator apparatus as claimed in claim 1 and further comprising a counter configured to receive the output signal from the time-encoding modulator and a counter clock signal and generate at least one count value of a number of periods of the counter clock signal in periods defined by the output signal.

17. The circuit as claimed in claim 16 wherein the time-encoding modulator apparatus comprises a latching element operable to receive a first clock signal synchronised to the counter clock signal and operable to synchronise any signal transitions output from the latching element to the first clock signal such that any signal transitions in the output from the modulator are synchronised to the first clock signal.

18. The circuit as claimed in claim 17 wherein the time-encoding modulator apparatus is configured such that the latching element is enabled in the first mode and disabled in the second mode.

19. A time encoding modulator comprising:
an input for receiving an input signal and an output for outputting an output signal;
a reconfigurable filter arrangement configured to receive the input signal and a feedback signal from the output and generate a filtered signal; and
a comparator configured to receive the filtered signal and output a time-encoded signal based at least in part on the filtered signal,
wherein reconfigurable filter arrangement comprises a first op-amp, a first capacitance and a switch network and wherein the reconfigurable filter arrangement is configurable in:
a first mode with the first op-amp enabled in a first signal path for at least the feedback signal and configured with the first capacitance to provide filtering to the first signal path; and
a second mode with the first capacitance coupled to a node of a second signal path for at least the feedback signal to provide filtering to the second signal path, wherein the second signal path bypasses the first op-amp.

20. A time-encoding modulator, the time-encoding modulator comprising:
an input node for receiving an input signal from a modulator input;
a filter arrangement coupled to the input node;
a comparator operable to receive a first signal from the filter arrangement at a first comparator input and generate a time-encoded signal;
a modulator output for outputting an output signal based on the time encoded signal; and
a feedback path extending from the modulator output to a first node of the filter arrangement;
wherein the filter arrangement comprises a first op-amp and first capacitance, and wherein the filter arrangement is selectively configurable in:
a first configuration with the first op-amp in a signal path between the first node and the first comparator input and the first capacitance coupled across the first op-amp; and
a second configuration in which the first node is connected to the first comparator input via a signal path that bypass the first op-amp, and the first capacitance is electrically connected between the first node and a reference voltage.

* * * * *

UNITED STATES PATENT AND TRADEMARK OFFICE
CERTIFICATE OF CORRECTION

PATENT NO. : 10,574,256 B1
APPLICATION NO. : 16/141555
DATED : February 25, 2020
INVENTOR(S) : John Paul Lesso It is certified that error appears in the above-identified patent and that said Letters Patent is hereby corrected as shown below:

In the Specification

1. In Column 2, Line 59, delete "filter; and" and insert -- filter, and --, therefor.

2. In Column 5, Line 58, delete "illustrates" and insert -- illustrate --, therefor.

3. In Column 5, Line 64, delete "on example" and insert -- an example --, therefor.

4. In Column 6, Line 5, delete "illustrates" and insert -- illustrate --, therefor.

5. In Column 8, Line 22, delete "first node 102" and insert -- first node 201 --, therefor.

6. In Column 8, Line 34, delete "first node 102" and insert -- first node 201 --, therefor.

7. In Column 11, Line 2, delete "switch arrangement 105" and insert -- switch network 105 --, therefor.

8. In Column 11, Line 8, delete "first node 102" and insert -- first node 201 --, therefor.

9. In Column 12, Line 23, delete "illustrates" and insert -- illustrate --, therefor.

10. In Column 13, Line 33, delete "delay element 106" and insert -- delay element 107 --, therefor.

11. In Column 13, Line 36, delete "illustrates" and insert -- illustrate --, therefor.

12. In Column 19, Line 3, delete "TDC 401" and insert -- TDC 301 --, therefor.

13. In Column 19, Line 38, delete "α-β or α-β" and insert -- α+β or α-β --, therefor.

14. In Column 20, Line 8, delete "TDC filter arrangement 705" and insert -- TDC filter arrangement Signed and Sealed this
Thirteenth Day of September, 2022

*Katherine Kelly Vidal*
Katherine Kelly Vidal
*Director of the United States Patent and Trademark Office*

704 --, therefor.

15. In Column 20, Line 23, delete "counter 702" and insert -- counter 701 --, therefor.

16. In Column 22, Line 43, delete "delay element 106," and insert -- delay element 107, --, therefor.

17. In Column 22, Line 56, delete "delay element 106" and insert -- delay element 107 --, therefor.

18. In Column 23, Line 2, delete "filter arrangement 105" and insert -- filter arrangement 102 --, therefor.

19. In Column 23, Lines 55-56, delete "may omitted" and insert -- may be omitted --, therefor.